(12) United States Patent
Yamazaki

(10) Patent No.: US 8,440,510 B2
(45) Date of Patent: May 14, 2013

(54) METHOD FOR MANUFACTURING SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 106 days.

(21) Appl. No.: 13/104,574

(22) Filed: May 10, 2011

(65) Prior Publication Data

US 2011/0281394 A1    Nov. 17, 2011

(30) Foreign Application Priority Data

May 14, 2010  (JP) ................................ 2010-112037

(51) Int. Cl.
*H01L 21/00* (2006.01)
*H01L 21/84* (2006.01)

(52) U.S. Cl.
USPC 438/149; 438/151; 257/E21.32; 257/E21.561

(58) Field of Classification Search .................. 438/149, 438/150, 151, 153
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| CN | 101656270 A | 2/2010 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Hoai V Pham
(74) *Attorney, Agent, or Firm* — Fish & Richardson P.C.

(57) ABSTRACT

The method for manufacturing the semiconductor device is as follows: forming a gate electrode; forming a first insulating film over the gate electrode; performing halogen doping treatment on the first insulating film so that the first insulating film is supplied with a halogen atom; forming an oxide semiconductor film over the first insulating film so as to overlap with the gate electrode; performing heat treatment on the oxide semiconductor film so that a hydrogen atom is removed in the oxide semiconductor film; performing oxygen doping treatment on the oxide semiconductor film from which the hydrogen atom is removed so that the oxide semiconductor film is supplied with an oxygen atom; performing heat treatment on the oxide semiconductor film to which the oxygen atom is supplied; forming a source electrode and a drain electrode on and in contact with the oxide semiconductor film; forming a second insulating film.

13 Claims, 17 Drawing Sheets

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1* | 10/2009 | Kawamura et al. ............ 257/43 |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0038641 A1 | 2/2010 | Imai |
| 2010/0044699 A1 | 2/2010 | Chung et al. |
| 2010/0051937 A1 | 3/2010 | Kaji et al. |
| 2010/0051940 A1 | 3/2010 | Yamazaki et al. |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0295041 A1 | 11/2010 | Kumomi et al. |
| 2011/0089416 A1 | 4/2011 | Yamazaki et al. |
| 2011/0193083 A1 | 8/2011 | Kim et al. |
| 2011/0215331 A1 | 9/2011 | Yamazaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2012/0119205 A1 | 5/2012 | Taniguchi et al. |

FOREIGN PATENT DOCUMENTS

| | | |
|---|---|---|
| EP | 1 976 018 A2 | 10/2008 |
| EP | 2141743 A1 | 1/2010 |
| EP | 2141744 A1 | 1/2010 |
| EP | 2 157 616 A1 | 2/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-237456 A | 10/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-335325 A | 12/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-212497 A | 9/2009 |
| JP | 2009-231613 A | 10/2009 |
| JP | 2010-016347 A | 1/2010 |
| JP | 2010-016348 A | 1/2010 |
| JP | 2010-050434 A | 3/2010 |
| JP | 2010-067954 A | 3/2010 |
| JP | 2010-080947 A | 4/2010 |
| KR | 2010-0023151 A | 3/2010 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3. 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13. 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/061120, dated Aug. 16, 2011, 4 pages.

Written Opinion, PCT Application No. PCT/JP2011/061120, dated Aug. 16, 2011, 5 pages.

Masaya Nakayama et al.; "17a-TL-8 Effect of GaO Layer on IGZO-TFT Channel"; Extended Abstracts (The 57th Spring Meeting 2010); The Japan Society of Applied Physics and Related Societies; Mar. 17, 2010; p. 21-008 with full English translation.

* cited by examiner

METHOD FOR MANUFACTURING SEMICONDUCTOR DEVICE

TECHNICAL FIELD

The present invention relates to a semiconductor device and a method for manufacturing the semiconductor device.

In this specification, a semiconductor device generally means a device which can function by utilizing semiconductor characteristics, and an electro-optic device, a semiconductor circuit, and electronic device are all semiconductor devices.

BACKGROUND ART

Attention has been focused on a technique for forming a transistor using semiconductor thin film formed over a substrate having an insulating surface. The transistor is applied to a wide range of electronic devices such as an integrated circuit (IC) or an image display device (display device). As a semiconductor thin film applicable to the transistor, a silicon-based semiconductor material is widely known; moreover, an oxide semiconductor has been attracting attention as another material.

For example, a transistor whose active layer uses an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

DISCLOSURE OF INVENTION

However, the electric conductivity of an oxide semiconductor changes when hydrogen or water forming an electron donor enters the oxide semiconductor during a device manufacturing process. Such a phenomenon becomes a factor of variation in the electric characteristics of a transistor using the oxide semiconductor.

In view of the above problems, one object is to provide a semiconductor device using an oxide semiconductor, which has stable electric characteristics and high reliability.

Dehydration or dehydrogenation by heat treatment, halogen doping treatment and oxygen doping treatment are performed in a manufacturing process of a transistor including an oxide semiconductor film.

One embodiment of the disclosed invention is a method for manufacturing a semiconductor device including the following steps: forming a gate electrode; forming a first insulating film over the gate electrode; performing halogen doping treatment on the first insulating film so that the first insulating film is supplied with a halogen atom; forming an oxide semiconductor film over the first insulating film so that the oxide semiconductor film overlaps with the gate electrode; performing first heat treatment on the oxide semiconductor film so that a hydrogen atom in the oxide semiconductor film is removed; performing oxygen doping treatment on the oxide semiconductor film from which the hydrogen atom is removed so that the oxide semiconductor film is supplied with an oxygen atom; performing second heat treatment on the oxide semiconductor film to which the oxygen atom is supplied; forming a source electrode and a drain electrode on and in contact with the oxide semiconductor film; and forming a second insulating film on and in contact with the oxide semiconductor film. Further, in the above method, a third insulating film containing nitrogen is formed so as to cover the second insulating film in some cases.

Another embodiment of the disclosed invention is a method for manufacturing a semiconductor device including the following steps: forming a first insulating film; performing halogen doping treatment on the first insulating film so that the first insulating film is supplied with a halogen atom; forming an oxide semiconductor film over the first insulating film; performing heat treatment on the oxide semiconductor film so that a hydrogen atom in the oxide semiconductor film is removed; performing oxygen doping treatment on the oxide semiconductor film from which the hydrogen atom is removed so that the oxide semiconductor film is supplied with an oxygen atom; performing heat treatment on the oxide semiconductor film to which the oxygen atom is supplied; forming a source electrode and a drain electrode on and in contact with the oxide semiconductor film; forming a second insulating film on and in contact with the oxide semiconductor film; and forming a gate electrode in a region over the second insulating film overlapping with the oxide semiconductor film. Further, in the above method, a third insulating film containing nitrogen is formed so as to cover the gate electrode in some cases.

In the above method, the oxide semiconductor film is processed into an island-shaped oxide semiconductor film in some cases after the oxide semiconductor film is formed. Further, in the step of processing the oxide semiconductor film into an island-shaped oxide semiconductor film, at least part of the first insulating film is also processed into an island-shaped first insulating film in some cases. Furthermore, the second insulating film is formed so as to be in contact with the first insulating film in some cases.

An insulating film containing a constituent element of the oxide semiconductor film is formed as the first insulating film or the second insulating film in some cases. Further, an insulating film containing a constituent element of the oxide semiconductor film and an insulating film containing an element different from the constituent element of the oxide semiconductor film are stacked to form the first insulating film or the second insulating film in some cases. Furthermore, in the above method, instead of the steps of forming the first insulating film and performing the halogen doping treatment on the first insulating film so that the first insulating film is supplied with the halogen atom, the following steps may be included in some cases: forming the insulating film containing the element different from the constituent element of the oxide semiconductor film as the first insulating film; performing the halogen doping treatment on the insulating film containing the element different from the constituent element of the oxide semiconductor film so that the insulating film containing the element different from the constituent element of the oxide semiconductor film is supplied with the halogen atom; and forming the insulating film containing the constituent element of the oxide semiconductor film over the insulating film containing the element different from the constituent element of the oxide semiconductor film as the first insulating film.

An insulating film containing gallium is formed as the first insulating film or the second insulating film in some cases. Further, an insulating film containing gallium and an insulating film containing a material different from gallium are formed as the first insulating film or the second insulating film in some cases. Furthermore, in the above method, instead of the steps of forming the first insulating film, and performing the halogen doping treatment on the first insulating film so that the first insulating film is supplied with the halogen atom, the following steps may be included in some cases: forming an insulating film containing the material different from gallium as the first insulating film; performing halogen doping treatment on the film containing the material different from gallium so that the insulating film containing the material different from gallium with the halogen atom; and forming the insulating film containing gallium over the insulating film containing the material different from gallium as the first insulating film.

Further, chlorine is preferably used in the halogen doping treatment.

Note that the term "gallium oxide" in this specification refers to oxygen and gallium as constituent elements unless otherwise particularly specified, and is not limited to only a gallium oxide. For example, "an insulating film containing a gallium oxide" can also be regarded as "an insulating film containing oxygen and gallium".

Further, in the above method, an insulating film containing nitrogen may be formed so as to cover the gate electrode. In the case where an insulating film includes silicon nitride or the like which does not contain hydrogen or contains an extremely small amount of hydrogen is used, oxygen which is added can be prevented from being released to the outside, and further, entry of hydrogen or water from the outside can be prevented. In this way, the insulating film is important.

Note that the above "halogen doping" means to add halogen typified by chlorine and fluorine to a bulk. For example, in the case where chlorine is used as halogen, at least one of a chlorine radical, a chlorine atom, and a chlorine ion is added to a bulk. The term "bulk" is used to define that halogen is added to the inside of a thin film in addition to a surface of the thin film Further, the term "halogen doping" includes "halogen plasma doping" by which plasma halogen is added to a bulk.

Note that the above-described "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

By the oxygen doping treatment, oxygen whose amount is greater than the stoichiometric proportion exists in at least one of the oxide semiconductor film (a bulk thereof), the insulating film (a bulk thereof), and an interface between the oxide semiconductor film and the insulating film. The amount of oxygen is preferably greater than the stoichiometric proportion and less than four times the stoichiometric proportion, more preferably greater than the stoichiometric proportion and less than twice the stoichiometric proportion. Here, an oxide containing excessive oxygen whose amount is greater than the stoichiometric proportion refers to, for example, an oxide which satisfies $2g>3a+3b+2c+4d+3e+2f$, where the oxide is expressed by $In_aGa_bZn_cSi_dAl_eMg_fO_g$ (a, b, c, d, e, f, g≧0). Note that oxygen which is added by the oxygen doping treatment may exist between lattices of the oxide semiconductor.

In addition, oxygen is added so that the amount of the added oxygen is larger than at least the amount of hydrogen in the oxide semiconductor subjected to dehydration or dehydrogenation. When the amount of oxygen is larger in at least any of the above structures, the oxygen is diffused and reacts with hydrogen which causes instability, so that hydrogen can be fixed (can be ionized to be an immobile ion). In other words, instability in reliability can be reduced or sufficiently reduced. In addition, with excessive oxygen, variation in a threshold voltage Vth caused by oxygen deficiency can be reduced and the amount of shift of the threshold voltage ΔVth can be reduced.

Note that oxygen whose amount is equal to the above-described amount preferably exists in two or more of the oxide semiconductor film (the bulk), the insulating film (the bulk), and the interface between the oxide semiconductor film and the insulating film.

Note that while it is acceptable that the amount of oxygen is equal to the stoichiometric proportion in a defect(oxygen deficiency)-free oxide semiconductor, in order to secure reliability, for example, to suppress variation in the threshold voltage of a transistor, it is preferable that an oxide semiconductor contain oxygen whose amount is greater than the stoichiometric proportion. Similarly, while the base film is not necessarily an insulating film containing excessive oxygen in the case of a defect(oxygen deficiency)-free oxide semiconductor, in order to secure reliability, for example, to suppress variation in the threshold voltage of a transistor, it is preferable that the base film be an insulating film containing excessive oxygen, considering the possibility of occurrence of oxygen deficiency in the oxide semiconductor layer.

Here, a state in which oxygen is added to the bulk by the above-described "oxygen plasma doping" treatment is described. Note that when oxygen doping treatment is performed on an oxide semiconductor film containing oxygen as one component, it is generally difficult to check an increase or a decrease of the oxygen concentration. Therefore, here, an effect of oxygen doping treatment was confirmed with a silicon wafer.

Oxygen doping treatment was performed with the use of an inductively coupled plasma (ICP) method. Conditions thereof were as follows: the ICP power is 800 W; the RF bias power 300 W or 0 W; the pressure 1.5 Pa; the gas flow rate 75 sccm; and the substrate temperature 70° C. FIG. 15 shows an oxygen concentration profile in the depth direction of the silicon wafer according to secondary ion mass spectrometry (SIMS) measurement. In FIG. 15, the vertical axis indicates an oxygen concentration; the horizontal axis indicates a depth from a surface of the silicon wafer.

It can be confirmed from FIG. 15 that oxygen is added in either of cases where the RF bias power is 0 W or the RF bias power is 300 W. Compared to the above cases, the amount of added oxygen is small in the case where a plasma treatment is not performed. In addition, in the case where the RF bias power is 300 W, oxygen is added more deeply than in the case of the RF bias power of 0 W.

Next, FIGS. 16A and 16B show results of observation of a cross section of the silicon wafer which has not yet been subjected to oxygen doping treatment and has been subjected to oxygen doping treatment, according to scanning transmission electron microscopy (STEM). FIG. 16A is a STEM image of the silicon wafer which has not yet been subjected to oxygen doping treatment. FIG. 16B is a STEM image of the silicon wafer which has been doped with oxygen at the RF bias power of 300 W. Referring to FIG. 16B, it can be confirmed that an oxygen-highly-doped region is formed in the silicon wafer by the oxygen doping.

As described above, it is shown that oxygen is added to the silicon wafer by doping the silicon wafer with oxygen. This result leads to an understanding that it is natural that oxygen can also be added to an oxide semiconductor film by doping the oxide semiconductor film with oxygen.

The effect of the structure which is an embodiment of the disclosed invention can be easily understood by considering as below. Note that the description below is just one exemplary consideration.

When a positive voltage is applied to the gate electrode, an electric field is generated from the gate electrode side of the oxide semiconductor film to the back channel side (the side opposite to the gate insulating film); accordingly, hydrogen ions having positive charge which exist in the oxide semiconductor film are transferred to the back channel side, and accumulated in the oxide semiconductor film side of an interface between the oxide semiconductor film and the insulating film. The positive charge is transferred from the accumulated hydrogen ion to a charge trapping center (such as a hydrogen atom, water, or contamination) in the insulating film, whereby negative charge is accumulated in the back channel side of the oxide semiconductor film. In other words, a parasitic channel is generated on the back channel side of the transistor, and the threshold voltage is shifted to the negative side, so that the transistor tends to be normally on.

In this manner, the charge trapping center such as hydrogen or water in the insulating film traps the positive charge and is transferred into the insulating film, which varies electrical characteristics of the transistor. Therefore, in order to suppress variation of the electrical characteristics of the transistor, it is important that there is no charge trapping center or the number of charge trapping centers is small in the insulating film. Therefore, a sputtering method by which less hydrogen is contained in film deposition is desirably used for formation of the insulating film. In an insulating film deposited by the sputtering method, there is no charge trapping center or the number of which is small, and thus, the transfer of positive charge is less likely to occur as compared to the case deposition is performed using a CVD method or the like. Consequently, the shift of the threshold voltage of the transistor can be suppressed and the transistor can be normally off.

Note that in a top-gate transistor, when an oxide semiconductor film is formed over an insulating film serving as a base and then heat treatment is performed thereon, not only water or hydrogen contained in the oxide semiconductor film but also water or hydrogen contained in the insulating film can be removed. Consequently, in the insulating film, there is a small number of charge trapping centers for trapping positive charge transferred through the oxide semiconductor film. In this manner, the heat treatment for dehydration or dehydrogenation is also performed on the insulating film located below the oxide semiconductor film, in addition to the oxide semiconductor film. Therefore, in the top-gate transistor, the insulating film serving as a base may be formed by a CVD method such as a plasma CVD method.

In a bottom-gate transistor, when an oxide semiconductor film is formed over a gate insulating film and then heat treatment is performed thereon, not only water or hydrogen contained in the oxide semiconductor film but also water or hydrogen contained in the gate insulating film can be removed. Consequently, in the gate insulating film, there is a small number of charge trapping centers for trapping positive charge transferred through the oxide semiconductor film. In this manner, the heat treatment for dehydration or dehydrogenation is also performed on the gate insulating film located below the oxide semiconductor film, in addition to the oxide semiconductor film. Therefore, in the bottom-gate transistor, the gate insulating film may be formed by a CVD method such as a plasma CVD method.

On the other hand, when a negative voltage is applied to the gate electrode, an electric field is generated from the back channel side to the gate electrode side; accordingly, hydrogen ions which exist in the oxide semiconductor film are transferred to the gate insulating film side and are accumulated in the oxide semiconductor film side of the interface between the oxide semiconductor film and the gate insulating film. As a result, the threshold voltage of the transistor is shifted to the negative side.

In a state of application of a gate voltage of 0, the positive charge is released from the charge trapping center, so that the threshold voltage of the transistor is shifted to the positive side, thereby returning to the initial state, or the threshold voltage is shifted to the positive side beyond the initial state in some cases. These phenomena indicate the existence of easy-to-transfer ions in the oxide semiconductor film. It can be considered that an ion that is transferred most easily is a hydrogen ion which is obtained by ionization of hydrogen that is the smallest atom.

In addition, the oxide semiconductor film absorbs light, whereby a bond of a metal element (M) and a hydrogen atom (H) (the bond also referred to as an M—H bond) in the oxide semiconductor film is cut by optical energy. Note that the optical energy having a wavelength of about 400 nm is equal to or substantially equal to the bond energy of a metal element and a hydrogen atom. When a negative gate bias is applied to a transistor in which the bond of a metal element and a hydrogen atom in the oxide semiconductor film is cut, a hydrogen ion detached from the metal element is attracted to the gate electrode side, so that distribution of electrical charge is changed, the threshold voltage of the transistor is shifted to the negative side, and the transistor tends to be normally on.

Note that the hydrogen ions transferred to the interface of the gate insulating film by light irradiation and application of the negative gate bias to the transistor are returned to the initial state by stopping application of the voltage. This can be regarded as a typical example of the ion transfer in the oxide semiconductor film.

In order to prevent such a change of the electrical characteristics by voltage application (BT deterioration) or a change of the electrical characteristics by light irradiation (light deterioration), it is important to remove a hydrogen atom or an impurity containing a hydrogen atom such as water thoroughly from the oxide semiconductor film to highly purify the oxide semiconductor film. The charge density as small as $10^{15}$ cm$^{-3}$, or the charge per unit area as small as $10^{10}$ cm$^{-2}$ does not affect the transistor characteristics or very slightly affects them. Therefore, it is preferable that the charge density is $10^{15}$ cm$^{-3}$ or less. Assuming that 10% of hydrogen contained in the oxide semiconductor film is transferred within the oxide semiconductor film, it is preferable that the concentration of hydrogen contained in the oxide semiconductor film is $10^{16}$ cm$^{-3}$ or less. Further, in order to prevent entry of hydrogen from the outside after a device is completed, it is preferable that a silicon nitride film formed by a sputtering method is used as a passivation film to cover the transistor.

Hydrogen or water can also be removed from the oxide semiconductor film by doping with oxygen which is excessive as compared to hydrogen contained in the oxide semiconductor film (such that (the number of hydrogen atoms)<< (the number of oxygen radicals) or (the number of oxygen ions)). Specifically, oxygen is made to be plasma by a radio-frequency wave (RF), the bias of the substrate is increased, and an oxygen radical and/or an oxygen ion are/is doped or added into the oxide semiconductor film over the substrate such that the amount of oxygen is greater than that of hydrogen in the oxide semiconductor film. The electronegativity of oxygen is 3.0 which is larger than about 2.0, the electronegativity of a metal (Zn, Ga, In) in the oxide semiconductor film, and thus, oxygen contained excessively as compared to hydrogen deprives the M—H bond of a hydrogen atom, so that an OH group is formed. This OH group may form an M—O—H group by being bonded to M.

The oxygen doping is preferably performed such that the amount of oxygen in the oxide semiconductor film is greater than the stoichiometric proportion. For example, in the case where an In—Ga—Zn—O-based oxide semiconductor film is used as the oxide semiconductor film, it is far preferable that the proportion of oxygen be made to be greater than the stoichiometric proportion and less than twice the stoichiometric proportion by oxygen doping or the like. For example, when a single-crystal In—Ga—Zn—O-based oxide semiconductor has the following stoichiometric proportion: In:Ga:Zn:O=1:1:1:4, in a thin oxide semiconductor film whose composition is expressed by $InGaZnO_x$, x is further preferably greater than 4 and less than 8. Consequently, the oxygen content of the oxide semiconductor film becomes larger than the hydrogen content thereof.

Optical energy or BT stress detaches a hydrogen ion from the M—H bond, which causes deterioration; however, in the case where oxygen is added by the above-described doping, added oxygen is bonded with a hydrogen ion, so that an OH group is formed. The OH group does not discharge a hydrogen ion even by light irradiation of the transistor or application of BT stress on the transistor because of its high bond energy, and is not easily transferred through the oxide semiconductor film because of its mass greater than the mass of a hydrogen ion. Consequently, an OH group formed by oxygen doping does not cause deterioration of the transistor or can suppress the deterioration.

In addition, it has been confirmed that as the thickness of the oxide semiconductor film is increased, the variation in the threshold voltage of a transistor tends to increase. It can be guessed that this is because an oxygen defect in the oxide semiconductor film is one cause of the change of the threshold voltage and increases as the thickness of the oxide semiconductor film is increased. A step of doping an oxide semiconductor film with oxygen in a transistor according to one embodiment of the disclosed invention is effective not only for removal of hydrogen or water from the oxide semiconductor film but also for compensation of an oxygen defect in the film. Consequently, the variation in the threshold voltage can also be controlled in the transistor according to one embodiment of the disclosed invention.

Metal oxide films each containing a component similar to that of the oxide semiconductor film may be provided so as to sandwich the oxide semiconductor film, which is also effective for prevention of change of the electrical characteristics. As the metal oxide film containing a component similar to that of the oxide semiconductor film, specifically, it is preferable to use a film containing at least one or more of metal elements selected from the constituent elements of the oxide semiconductor film. Such a material is compatible with the oxide semiconductor film, and therefore, when the metal oxide films are provided so as to sandwich the oxide semiconductor film, the state of the interface with the oxide semiconductor film can be kept well. That is, by providing the metal oxide film using the above-described material as an insulating film which is in contact with the oxide semiconductor film, accumulation of hydrogen ions at the interface between the metal oxide film and the oxide semiconductor film and in the vicinity thereof can be suppressed or prevented. Thus, as compared to the case where insulating films each containing a component different from that of the oxide semiconductor film, such as silicon oxide films, are provided so as to sandwich the oxide semiconductor film, the hydrogen concentration at the interface of the oxide semiconductor film, which affects the threshold voltage of the transistor, can be satisfactorily decreased.

Gallium oxide films are preferably used as the metal oxide films. Since a gallium oxide has a wide bandgap (Eg), by providing gallium oxide films so as to sandwich the oxide semiconductor film, an energy barrier is formed at the interface between the oxide semiconductor film and the metal oxide film to prevent carrier transport in the interface. Consequently, carriers do not travel from the oxide semiconductor to the metal oxide, but travels through the oxide semiconductor film. On the other hand, hydrogen ions pass through the interface between the oxide semiconductor and the metal oxide and are accumulated in the vicinity of the interface between the metal oxide and the insulating film. Even when the hydrogen ions are accumulated in the vicinity of the interface with the insulating film, a parasitic channel through which carriers can flow is not formed in the metal oxide film such as a gallium oxide film, which results in no affect or a very slight affect on the threshold voltage of the transistor. The energy barrier in the case where a gallium oxide is in contact with an In—Ga—Zn—O-based material is about 0.8 eV on the conduction band side and is about 0.9 eV on the valence band side.

One technical idea of a transistor according to one embodiment of the disclosed invention is to increase the amount of oxygen contained in at least one of an insulating film in contact with an oxide semiconductor film, the oxide semiconductor film, and the vicinity of an interface between them by oxygen doping treatment.

Moreover, hydrogen can be further removed from the oxide semiconductor film by performing halogen doping treatment on the insulating film over which the oxide semiconductor film is formed, before the formation of the oxide semiconductor film. For example, in the case where chlorine is used as halogen, chlorine is made into plasma using high-frequency waves (RF) and a chlorine radical and a chlorine ion are added to an insulating film over a substrate. At this time, the substrate over which the insulating film is formed is preferably biased. Chlorine can be deeply added to the insulating film by increasing the bias applied to the substrate. Halogen may be added by performing irradiation with a halogen ion accelerated by an electric field. Further, oxygen may be added at the same time as halogen.

The electronegativity of halogen such as chlorine and fluorine is larger than that of a metal (Zn, Ga, and In) in an oxide semiconductor film, whereby a hydrogen atom can be taken away from M—H bond in the oxide semiconductor film. Thus, a hydrogen ion detached from M—H bond in the oxide semiconductor film which causes deterioration of a transistor can be trapped by halogen such as chlorine and fluorine added at an interface between the oxide semiconductor film and the insulating film. Moreover, hydrogen in the insulating film can be fixed and be prevented from diffusing into the oxide semiconductor film from the insulating film by halogen such as chlorine and fluorine in the insulating film. Consequently, deterioration in the characteristics of a transistor can be suppressed or reduced even when light irradiation is performed on the transistor and BT stress is applied thereto.

The technical idea of a transistor according to one embodiment of the disclosed invention is to add halogen, typified by chlorine, to at least any one of an insulating film in contact with an oxide semiconductor film and the vicinity of the interface between the insulating film and the oxide semiconductor film, by halogen doping treatment.

A transistor including an oxide semiconductor film subjected to dehydration or dehydrogenation by heat treatment, halogen doping treatment, and oxygen doping treatment can be a highly reliable transistor having stable electrical characteristics in which the amount of change in threshold voltage of the transistor between before and after the bias-temperature stress (BT) test can be reduced.

According to one embodiment of the disclosed invention, a variety of semiconductor devices including highly reliable transistors with favorable electrical characteristic can be manufactured.

BEST MODE FOR CARRYING OUT THE INVENTION

Hereinafter, embodiments of the invention disclosed in this specification will be described in detail with reference to drawings. Note that the invention disclosed in this specification is not limited to the following description, and it is easily understood by those skilled in the art that modes and details can be variously changed. Further, the invention disclosed in this specification is not construed as being limited to the description of the following embodiments.

In this specification and the like, ordinal numbers such as "first", "second", and "third" are used in order to avoid confusion among components, and the terms do not limit the components numerically.

(Embodiment 1)

In this embodiment, a semiconductor device and a method for manufacturing the semiconductor device will be described with reference to FIGS. 1A to 1C, FIGS. 2A to 2F, and FIGS. 3A to 3F.

<Example of Structure of Semiconductor Device>

Figure 1A:
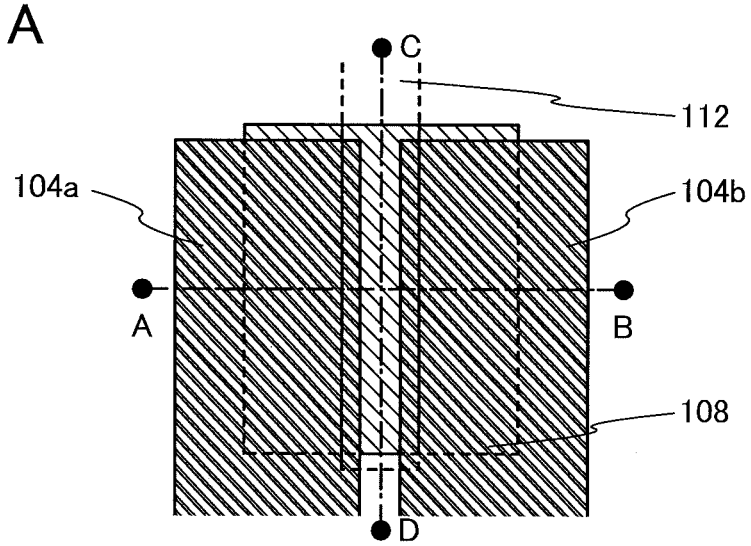
FIGS. 1A to 1C are views illustrating one embodiment of a semiconductor device.
Figure 1B:
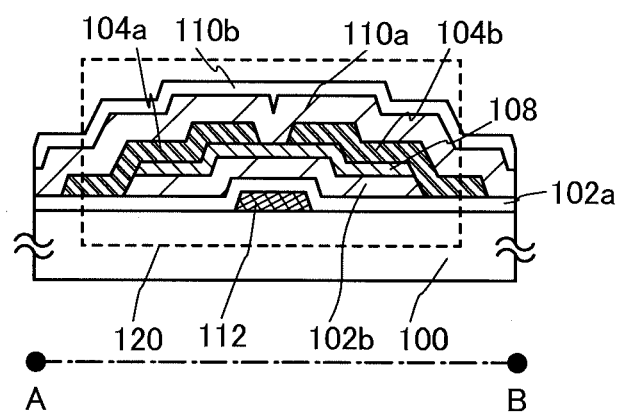
Figure 1C:
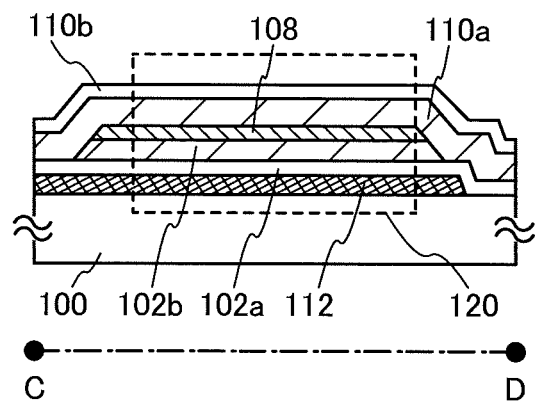

A structural example of a transistor 120 is shown in FIGS. 1A to 1C. Here, FIG. 1A is a plan view, FIG. 1B is a cross-sectional view along A-B of FIG. 1A, and FIG. 1C is a cross-sectional view along C-D of FIG. 1A. Note that in FIG. 1A, part of components of the transistor 120 (for example, an insulating film 110a, an insulating film 110b) are omitted for brevity.

The transistor 120 shown in FIGS. 1A to 1C includes a gate electrode 112, a gate insulating film 102a, a gate insulating film 102b, an oxide semiconductor film 108, a source electrode 104a, a drain electrode 104b, the insulating film 110a, and the insulating film 110b, which are found over a substrate 100.

In the transistor 120 shown in FIGS. 1A to 1C, the oxide semiconductor film 108 is an oxide semiconductor film subjected to oxygen doping treatment. The transistor 120 having high reliability is realized by performing oxygen doping treatment.

Moreover, halogen doping treatment is performed on the gate insulating film 102a in the transistor 120 shown in FIGS. 1A to 1C. The transistor 120 having higher reliability is realized by such halogen doping treatment.

<Example of Manufacturing Steps of Semiconductor Device>

Hereinafter, an example of manufacturing steps of the semiconductor device shown in FIGS. 1A to 1C is described with reference to FIGS. 2A to 2F.

Figure 2A:
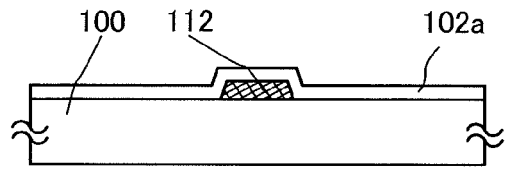
FIGS. 2A to 2F are views illustrating one embodiment of a method for manufacturing a semiconductor device.

First, a conductive film is formed over the substrate 100 having an insulating surface, and then the gate electrode 112 is formed through a photolithography step (see FIG. 2A). Note that a resist mask may be formed by an inkjet method. Formation of the resist mask by an inkjet method needs no photomask; thus, manufacturing cost can be reduced.

There is no particular limitation on the property of a material and the like of the substrate 100 as long as the material has heat resistance high enough to withstand at least heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like; a compound semiconductor substrate made of silicon germanium or the like; an SOI substrate; or the like may be used as the substrate 100. Still alternatively, any of these substrates further provided with a semiconductor element may be used as the substrate 100.

A flexible substrate may alternatively be used as the substrate 100. In the case where a transistor is provided over a flexible substrate, the transistor can be directly formed over the flexible substrate. Alternatively, the transistor may be formed over a different substrate, separated from the substrate, and then transferred to the flexible substrate. In order to separate the transistor to transfer it to the flexible substrate, a separation layer is preferably formed between the different substrate and the transistor.

An insulating film serving as a base film may be provided between the substrate 100 and the gate electrode 112. The base film has a function of preventing diffusion of an impurity element from the substrate 100, and can be formed to have a single-layer structure or a stacked-layer structure using one or more films selected from a silicon nitride film, a silicon oxide film, a silicon nitride oxide film, and a silicon oxynitride film.

The gate electrode 112 can be formed by a plasma CVD method, a sputtering method, or the like. The gate electrode 112 can be formed to have a single-layer structure or a stack-layer structure using a metal material such as molybdenum, titanium, tantalum, tungsten, aluminum, copper, neodymium, or scandium, or an alloy material which contains any of these materials as a main component.

Next, the gate insulating film 102a is formed over the gate electrode 112 (see FIG. 2A).

It is preferable to use an insulating material containing a material different from that of the oxide semiconductor film formed later, for the gate insulating film 102a. The gate insulating film 102a can be fainted using a single layer or a stacked layer of silicon oxide, silicon nitride, silicon oxynitride, silicon nitride oxide, aluminum oxide, aluminum nitride, aluminum oxynitride, aluminum nitride oxide, or hafnium oxide, or a mixed material thereof, by a plasma CVD method, a sputtering method, or the like. Considering that the gate insulating film 102a functions as a gate insulating film of a transistor, a material having a high dielectric constant such as hafnium oxide, tantalum oxide, yttrium oxide, hafnium silicate ($HfSi_xO_y$ (x>0, y>0)), hafnium aluminate ($HfAl_xO_y$, (x>0, y>0)), hafnium silicate to which nitrogen is added, hafnium aluminate to which nitrogen is added may be employed. Note that a sputtering method or the like is preferable in terms of low possibility of entry of hydrogen, water, and the like.

Figure 2B:
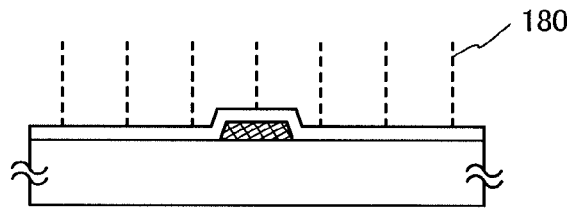

Next, treatment by halogen 180 (also referred to as halogen doping treatment or halogen plasma doping treatment) is performed on the gate insulating film 102a, whereby halogen is contained in the gate insulating film 102a (see FIG. 2B). Chlorine, fluorine, or the like can be used as the halogen 180. Since the electronegativity of halogen such as chlorine and fluorine is large, a hydrogen ion which causes deterioration in a transistor can be trapped. Hydrogen in the gate insulating film 102a can be fixed and be prevented from diffusing into the oxide semiconductor film 108 from the gate insulating film 102a by containing halogen, such as chlorine, to the gate insulating film 102a over which the oxide semiconductor film 108 is formed. Consequently, deterioration in the characteristics of a transistor is suppressed or reduced even when light irradiation is performed on the transistor or BT stress is applied thereto.

Here, since the atomic radius of chlorine is larger than that of fluorine and the diffusion coefficient of chlorine is smaller than that of fluorine, a hydrogen ion is easily fixed in the gate insulating film 102a by chlorine. In particular, when heat treatment is performed later, chlorine is less likely to move compared to fluorine; therefore, a hydrogen ion can be trapped more effectively. Consequently, chlorine is preferably used as the halogen 180. In this embodiment, chlorine is used as the halogen 180. In the case where chlorine is used as the halogen 180, at least any of a chlorine radical, a chlorine atom, and a chlorine ion is included in the halogen 180.

The above-described halogen 180 can be generated by a plasma generating apparatus and an ozone generating apparatus. Specifically, for example, the gate insulating film 102a can be processed by generating the halogen 180 using an apparatus capable of performing etching treatment on a semiconductor device, an apparatus capable of performing ashing on a resist mask, or the like. Note that addition of halogen is preferably performed under a condition that damage to a surface of the gate insulating film 102a is minimized.

In order to add halogen more preferably, a substrate may be electrically biased. Halogen can be deeply added to the gate insulating film 102a by increasing the bias applied to the substrate.

In the case where chlorine is added using an inductively coupled plasma (ICP) apparatus, it is preferable to apply high frequency power supply of 1 kW or more and 10 kW or less to an ICP coil that is a plasma generation source, and to keep a state where the plasma is generated for a certain period (30 seconds or more and 600 seconds or less). For example, chlorine doping treatment may be performed under a condition that ICP power is 6000 W, bias power is 250 W, chlorine gas flow rate is 500 sccm, pressure of a treatment chamber is 1.3 Pa, and treatment time is 60 seconds.

Further, halogen may be added by performing irradiation with a halogen ion accelerated by an electric field.

Oxygen may be added at the same time as halogen typified by chlorine.

Figure 2C:
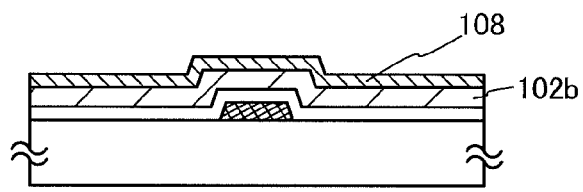

Next, the gate insulating film 102b is formed over the gate insulating film 102a (see FIG. 2C).

For the gate insulating film 102b, it is particularly preferable to use an insulating material containing a component similar to that of the oxide semiconductor film formed later. Such a material is compatible with the oxide semiconductor film; thus, when it is used for the gate insulating film 102b, the state of the interface between the oxide semiconductor film and the gate insulating film 102b can be kept favorably. Here, "a component similar to that of the oxide semiconductor film" means one or more of elements selected from constituent metal elements of the oxide semiconductor film For example, in the case where the oxide semiconductor film is constituted of an In—Ga—Zn—O-based oxide semiconductor material, gallium oxide or the like can be given as the insulating material containing a component similar to that of the oxide semiconductor film.

Further, as shown in FIG. 2C, the gate insulating film is more preferably a stacked-layer structure of the gate insulating film 102a containing a material different from that of the oxide semiconductor film and the gate insulating film 102b containing an insulating material which contains a component similar to that of the oxide semiconductor film. Charges are preferentially trapped in charge trapping centers at the interface between the gate insulating film 102a and the gate insulating film 102b (compared to the interface between the oxide semiconductor film and the gate insulating film 102b) by stacking the gate insulating film 102a, the gate insulating film 102b, and the oxide semiconductor film in this order. Thus, charges can be satisfactorily prevented from being trapped at the interface between the oxide semiconductor film and the gate insulating film 102b, whereby reliability of the semiconductor device is increased. In addition, charges can be more preferentially trapped in the charge trapping centers at the interface between the gate insulating film 102a and the gate insulating film 102b by performing the above-described halogen doping treatment on the gate insulating film 102a.

As such a stacked-layer structure of the gate insulating films 102a and 102b, a stacked-layer structure of a gallium oxide film and a silicon oxide film, a stacked-layer structure of a gallium oxide film and a silicon nitride film, or the like can be applied.

Note that the gate insulating film of the transistor 120 shown in FIGS. 1A to 1C has a stacked-layer structure of the gate insulating film 102a containing a material different from that of the oxide semiconductor film and the gate insulating film 102b containing an insulating material which contains a component similar to that of the oxide semiconductor film; however, the structure of the gate insulating film is not limited to this. For example, the gate insulating film may be formed of either of the gate insulating film 102a containing a material different from that of the oxide semiconductor film or the gate insulating film 102b containing an insulating material which contains a component similar to that of the oxide semiconductor film.

A high-density plasma CVD method using microwaves (e.g., with a frequency of 2.45 GHz) is preferably employed for forming the gate insulating films 102a and 102b because an insulating layer which is formed can be dense and can have high breakdown voltage and high quality. This is because when a highly purified oxide semiconductor is closely in contact with a high-quality gate insulating film, the interface state can be reduced and interface properties can be favorable.

Next, the oxide semiconductor film 108 is formed over the gate insulating film 102b so as to overlap with the gate electrode 112 (see FIG. 2C).

The oxide semiconductor film is preferably formed by a method in which hydrogen, water, or the like does not easily enter the oxide semiconductor film. For example, the oxide semiconductor film can be formed by a sputtering method or the like. The thickness of the oxide semiconductor film is desirably 3 nm or more and 30 nm or less. This is because the transistor might be normally on when the oxide semiconductor film is too thick (e.g., the thickness is 50 nm or more).

For example, an oxide semiconductor material containing indium, an oxide semiconductor material containing indium and gallium, or the like can be given as a material used for the oxide semiconductor film.

As a material used for the oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; or a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

The oxide semiconductor film can be a thin film using a material expressed by the chemical formula, $InMO_3(ZnO)_m$, (m>0). Here, M represents one or more metal elements selected from Ga, Al, Mn, and Co. For example, M can be Ga, Ga and Al, Ga and Mn, Ga and Co, or the like.

In this embodiment, the oxide semiconductor film is formed by a sputtering method using an In—Ga—Zn—O-based oxide semiconductor deposition target.

As an In—Ga—Zn—O-based oxide semiconductor deposition target, for example, an oxide semiconductor deposition target having a composition ratio of $In_2O_3:Ga_2O_3:ZnO=1:1:1$ [molar ratio] can be used. Note that it is not necessary to limit the material and the composition ratio of the target to the above. For example, an oxide semiconductor deposition target having a composition ratio of $In_2O_3:Ga_2O_3:ZnO=1:1:2$ [molar ratio] can also be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the oxide semiconductor deposition target is set to 90% or more and 100% or less, preferably 95% or more and 99.9% or less. With the use of an oxide semiconductor deposition target with high filling rate, a dense oxide semiconductor film can be formed.

A deposition atmosphere may be a rare gas (typically argon) atmosphere, an oxygen atmosphere, a mixed atmosphere of a rare gas and oxygen, or the like. Further, the deposition atmosphere is desirably an atmosphere using a high-purity gas from which impurities containing hydrogen atoms such as hydrogen, water, a hydroxyl group, and hydride are satisfactorily removed, in order to prevent hydrogen, water, a hydroxyl group, and hydride from entering the oxide semiconductor film.

More specifically, for example, the oxide semiconductor film can be formed as follows.

First, the substrate 100 is placed in a deposition chamber kept under reduced pressure, and the substrate temperature is set to a temperature of 100° C. or higher and 600° C. or lower, preferably 200° C. or higher and 400° C. or lower. This is because when deposition is performed in the state where the substrate 100 is heated, the concentration of impurities in the oxide semiconductor film can be reduced. Moreover, damage due to sputtering can be reduced.

Then, a high-purity gas from which impurities containing hydrogen atoms such as hydrogen and water are satisfactorily removed is introduced into the deposition chamber while remaining moisture is being removed, and the oxide semiconductor film is formed over the substrate 100 with the use of the above target. In order to remove moisture remaining in the deposition chamber, an entrapment vacuum pump such as a cryopump, an ion pump, or a titanium sublimation pump is desirably used. The evacuation unit may be a turbo molecular pump provided with a cold trap. In the deposition chamber which is evacuated with the cryopump, a hydrogen molecule, a compound containing a hydrogen atom, such as water ($H_2O$), (more preferably, also a compound containing a carbon atom), and the like are removed, whereby the concentration of impurities contained in the oxide semiconductor film formed in the deposition chamber can be reduced.

As an example of the deposition condition, the distance between the substrate and the target can be set to 100 mm; the pressure, 0.6 Pa; the direct-current (DC) power supply, 0.5 kW; and the deposition atmosphere, an oxygen atmosphere (the flow rate of the oxygen is 100%). Note that a pulsed direct-current power source is preferable because powder substances (also referred to as particles or dust) generated in deposition can be reduced and the film thickness can be uniform.

Then, the oxide semiconductor film 108 is subjected to heat treatment. Excessive hydrogen (including water and a hydroxyl group) in the oxide semiconductor film 108 is removed through this heat treatment and the structure of the oxide semiconductor film is modified, so that defect levels in an energy gap can be reduced. The heat treatment is performed at 250° C. or higher and 650° C. or lower, preferably 450° C. or higher and 600° C. or lower, or lower than the strain point of the substrate.

For example, an object to be heated is introduced into an electric furnace using a resistance heating element or the like, and the heat treatment is performed in a nitrogen atmosphere at 450° C. for an hour. The oxide semiconductor film 108 is not exposed to the air during the heat treatment so that entry of water and hydrogen can be prevented.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal)

apparatus can be used. A GRTA apparatus is an apparatus for performing heat treatment using a high-temperature gas. As the gas, an inert gas which does not react with an object to be processed by heat treatment, such as nitrogen or a rare gas such as argon is used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

For example, as the heat treatment, heat treatment using the GRTA apparatus may be performed as follows. The object to be processed is put in a heated inert gas atmosphere, heated for several minutes, and then taken out of the inert gas atmosphere. The GRTA process enables high-temperature heat treatment for a short time. The GRTA process can be employed even when the temperature exceeds the upper temperature limit of the object to be processed. Note that the inert gas may be switched to a gas containing oxygen during the process. This is because a defect level in an energy gap caused by oxygen deficiency can be reduced by performing the heat treatment in the atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or more, preferably 7 N (99.99999%) or more (that is, the concentration of the impurities 1 ppm or less, preferably 0.1 ppm or less).

The above heat treatment can be referred to as dehydration treatment, dehydrogenation treatment, or the like because of its advantageous effect of removing hydrogen, water, and the like. The dehydration treatment or dehydrogenation treatment may be performed at the timing, for example, after the oxide semiconductor film is processed into an island-shaped oxide semiconductor film. Such dehydration treatment or dehydrogenation treatment may be conducted once or plural times. In addition, hydrogen or the like entered the gate insulating film 102a and the like through the halogen doping treatment can be removed by this heat treatment.

Figure 2D:
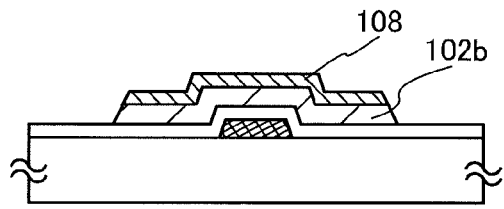

Next, the oxide semiconductor film 108 is processed and the island-shaped oxide semiconductor film 108 is formed (see FIG. 2D).

The oxide semiconductor film 108 can be processed by being etched after a mask having a desired shape is formed over the oxide semiconductor film. The mask can be formed by a method such as photolithography. The mask may be alternatively formed by a method such as an inkjet method.

At this time, the gate insulating film 102b containing an insulating material which contains a component similar to that of the oxide semiconductor film 108 may be etched with the oxide semiconductor film 108, and may be processed to have island shape.

The oxide semiconductor film 108 and the gate insulating film 102b may be etched by either wet etching or dry etching. It is needless to say that both of them may be used in combination.

Note that the oxide semiconductor film 108 is not necessarily processed to have island shape.

Figure 2E:
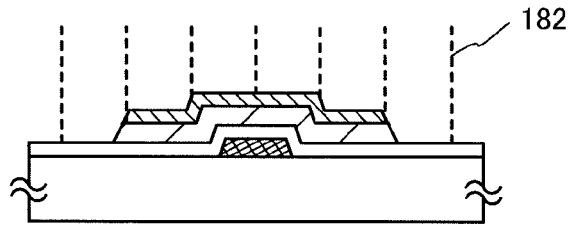

Next, the oxide semiconductor film 108 is subjected to treatment using an oxygen 182 (also referred to as oxygen doping treatment and oxygen plasma doping treatment) (see FIG. 2E). Here, at least any of an oxygen radical, an oxygen atom, and an oxygen ion is included in the oxygen 182. By performing oxygen doping treatment on the oxide semiconductor film 108, the oxygen can be contained either or both in the oxide semiconductor film 108 or/and in the vicinity of the interface of the oxide semiconductor film 108. In that case, the oxygen content is greater than the stoichiometric proportion of the oxide semiconductor film 108, preferably greater than the stoichiometric proportion and less than twice the stoichiometric proportion. Alternatively, the oxygen content may be greater than Y, preferably greater than Y and less than 2Y, where the oxygen amount in the case where a material of the oxide semiconductor film is single-crystalline is Y. Still alternatively, the oxygen content may be greater than Z, preferably greater than Z and less than 2Z based on the oxygen amount Z of the oxide semiconductor film in the case where oxygen doping treatment is not performed. The reason why the above preferable range has the upper limit is that hydrogen might be taken up by the oxide semiconductor film 108 like a hydrogen-storing alloy when the oxygen content is too high. Note that in the oxide semiconductor film, the oxygen content is higher than the hydrogen content.

In the case of a material whose crystalline structure is expressed by $InGaO_3(ZnO)_m$ (m>0), x in $InGaZnO_x$ can be greater than 4 and less than 8 when the crystalline structure where m is 1 ($InGaZnO_4$) is used as the reference, and x in $InGaZn_2O_x$ can be greater than 5 and less than 10 when the crystalline structure where m is 2 ($InGaZn_2O_5$) is used as the reference. Such an excessive oxygen region may exist in part of the oxide semiconductor (including the interface).

In the oxide semiconductor film, oxygen is one of the main component materials. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Incidentally, it is known that oxygen contains isotopes such as $^{17}O$ and $^{18}O$ and the proportions of $^{17}O$ and $^{18}O$ in all of the oxygen atoms in nature is about 0.037% and about 0.204%, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes in some cases. Thus, the concentrations of these isotopes may be measured to determine whether oxygen is intentionally added to the oxide semiconductor film.

For example, when the concentration of $^{18}O$ is used as the reference, it can be said that D1 ($^{18}O$)>D2 ($^{18}O$) is satisfied between the concentration of an isotope of oxygen D1 ($^{18}O$) in a region of the oxide semiconductor film, which has been added with oxygen, and the concentration of an isotope of oxygen D2 ($^{18}O$) in a region of the oxide semiconductor film, which is not been doped with oxygen.

It is preferable that at least part of the oxygen 182 added to the oxide semiconductor film have dangling bonds in the oxide semiconductor film. This is because such dangling bonds are linked with hydrogen remaining in the film so that hydrogen can be fixed (made to be immobile ions).

The oxygen 182 can be generated by a plasma generating apparatus or an ozone generating apparatus. Specifically, for example, the oxygen 182 is generated using an apparatus capable of performing etching on a semiconductor device, an apparatus capable of performing ashing on a resist mask, or the like, and the oxide semiconductor film 108 can be processed. Alternatively, the oxygen may be added by performing irradiation with an oxygen ion accelerated by an electric field.

Note that it is desirable to apply an electrical bias to the substrate in order to perform oxygen doping more favorably.

Note that the heat treatment is desirably performed on the oxide semiconductor film 108 after being subjected to the oxygen doping treatment. The heat treatment temperature is 250° C. or higher and 700° C. or lower, preferably 400° C. or higher and 600° C. or lower, or lower than the strain point of the substrate.

Water, hydroxide (OH), or the like generated by the reaction of hydrogen and an oxide semiconductor material can be removed from the oxide semiconductor film by this heat treatment. Hydrogen or the like entered the oxide semiconductor film 108 or the like due to the above oxygen doping treatment can also be removed by this heat treatment. The heat treatment may be performed in an atmosphere from which water, hydrogen, or the like is satisfactorily reduced, such as a nitrogen atmosphere, an oxygen atmosphere, an ultra-dry air atmosphere (the moisture amount is 20 ppm (−55° C. by conversion into a dew point) or less, preferably 1 ppm or less, more preferably 10 ppb or less when measured with the use of a dew point meter of a cavity ring down laser spectroscopy (CRDS) system), or a rare gas atmosphere (such as argon and helium). In particular, the heat treatment is preferably performed in an atmosphere containing oxygen. Alternatively, nitrogen, oxygen, or a rare gas introduced to the heat treatment apparatus preferably has a purity of 6N (99.9999%) or more (that is, concentration of impurities is 1 ppm or less), more preferably 7N (99.99999%) or more (that is, concentration of impurities is 0.1 ppm or less).

The oxygen doping treatment and the heat treatment may be performed repeatedly. Reliability of the transistor can be more improved by performing the treatments repeatedly. Note that the number of repetition times can be set as appropriate.

In the heat treatment according to this embodiment, the oxide semiconductor film 108 is desirably heated in an atmosphere containing oxygen. Consequently, oxygen which might be reduced by the above dehydration treatment (or dehydrogenation treatment) can be supplied to the oxide semiconductor film 108. From this aspect, the heat treatment can be referred to as supply of oxygen.

Note that there is no particular limitation on the timing of the heat treatment for supply of oxygen as long as it is after formation of the oxide semiconductor film 108. For example, the heat treatment for supply of oxygen may be performed after formation of the insulating film 110a described later. Alternatively, the heat treatment for supply of oxygen may be performed after the gate electrode is formed. Still alternatively, the heat treatment for supply of oxygen may be performed following the heat treatment for dehydration or the like, the treatment for dehydration or the like may also serve as the heat treatment for supply of oxygen, or the treatment for supply of oxygen may also serve as the heat treatment for dehydration or the like.

As described above, the heat treatment for dehydration or the like and oxygen doping treatment or the heat treatment for supply of oxygen are applied, whereby the oxide semiconductor film 108 can be highly purified so as to contain impurities other than main components of the oxide semiconductor film 108 as little as possible. The highly purified oxide semiconductor film 108 contains extremely few (close to zero) carriers derived from a donor. Impurities are reduced by the heat treatments so that an i-type (intrinsic) or substantially i-type oxide semiconductor film is obtained. Consequently, a transistor having highly excellent characteristics can be realized.

Note that in this embodiment, the heat treatment for dehydration or the like is performed, the oxide semiconductor film 108 is processed into the island-shaped oxide semiconductor film 108, the oxygen doping treatment is performed, and the heat treatment for supply of oxygen is performed; however, these steps are not limited to this order.

Figure 2F:
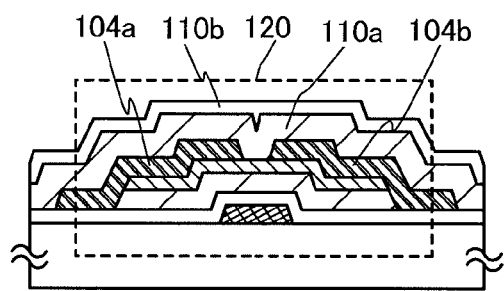

Next, a conductive film for forming the source electrode and the drain electrode (including a wiring formed in the same layer as the source electrode and the drain electrode) is formed over the gate insulating film 102a, the gate insulating film 102b, and the oxide semiconductor film 108 and processed to form the source electrode 104a and the drain electrode 104b (see FIG. 2F). The channel length L of the transistor depends on the distance between the edges of the source electrode 104a and the drain electrode 104b which are formed here.

As the conductive film used for the source electrode 104a and the drain electrode 104b, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like may be used. Alternatively, a conductive film may be used in which a high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like.

Alternatively, the conductive film used for the source electrode 104a and the drain electrode 104b may be formed using a conductive metal oxide. As the conductive metal oxide, an indium oxide ($In_2O_3$), a tin oxide ($SnO_2$), a zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials containing a silicon oxide may be used.

The conductive film may be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

An etching step may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask, resulting in simplification of the steps.

Next, the insulating film 110a being in contact with part of the oxide semiconductor film 108 and covering the source electrode 104a and the drain electrode 104b, and the insulating film 110b covering the source electrode 104a and the drain electrode 104b are formed (see FIG. 2F).

The insulating film 110a can be formed in a similar manner to the gate insulating film 102b. That is, it is preferable to use an insulating material containing a component similar to that of the oxide semiconductor film 108 for the insulating film 110a. Such a material is compatible with the oxide semiconductor film; thus, when it is used for the insulating film 110a, the state of the interface between the oxide semiconductor film 108 and the insulating film 110a can be kept favorably. In the case where the oxide semiconductor film 108 is formed of an In—Ga—Zn—O-based oxide semiconductor material, gallium oxide or the like is given as the insulating film comprising a component similar to that of the oxide semiconductor film 108, for example.

Further, the insulating film 110a preferably contains much oxygen that exceeds the stoichiometric proportion, more preferably contains oxygen more than 1 time and less than two times the stoichiometric proportion. When the insulating film 110a thus contains excessive oxygen, oxygen is supplied to the oxide semiconductor film 108 and the interface between the insulating film 110a and the oxide semiconductor film 108, so that oxygen deficiency can be reduced.

The insulating film 110b can be formed in a similar manner to the gate insulating film 102a. That is, the insulating film 110b can be formed to have a single-layer structure or a stacked-layer structure using a material such as silicon oxide, silicon nitride, silicon oxynitride, silicon nitride oxide, aluminum oxide, aluminum nitride, aluminum oxynitride, aluminum nitride oxide, or hafnium oxide, or a mixed material of these.

The insulating film 110b preferably contains much oxygen that exceeds the stoichiometric proportion, more preferably contains oxygen more than 1 time and less than twice of the stoichiometric proportion. When the insulating film 110b thus contains excessive oxygen, oxygen is supplied to the oxide semiconductor film 108 and the interface between the insulating film 110b and the oxide semiconductor film 108, so that oxygen deficiency can be reduced.

Here, it is preferable to employ a stacked-layer structure of the insulating film 110a containing an insulating material which contains a component similar to that of the oxide semiconductor film and the insulating film 110b containing a material different from that of the oxide semiconductor film. Charges are preferentially trapped in charge trapping centers at the interface between the insulating film 110a and the insulating film 110b (compared to the interface between the oxide semiconductor film and the insulating film 110a) by stacking the oxide semiconductor film 108, the insulating film 110b, and the insulating film 110a in this order. Thus, charges can be satisfactorily prevented from being trapped at the interface between the oxide semiconductor film and the insulating film 110a, whereby reliability of the semiconductor device is increased.

As such a stacked-layer structure of the insulating films 110a and 110b, a stacked-layer structure of a gallium oxide film and a silicon oxide film, a stacked-layer structure of a gallium oxide film and a silicon nitride film, or the like can be applied.

Note that the insulating film of the transistor 120 shown in FIGS. 1A to 1C has a stacked-layer structure of the insulating film 110a containing an insulating material which contains a component similar to that of the oxide semiconductor film and the insulating film 110b containing a material different from that of the oxide semiconductor film; however, the structure of the insulating film is not limited to this. For example, the insulating film may be formed of either of the insulating film 110a containing an insulating material which contains a component similar to that of the oxide semiconductor film and the insulating film 110b containing a material different from that of the oxide semiconductor film.

Note that it is preferable to form the insulating film 110a or the insulating film 110b so as to be in contact with the gate insulating film 102a or the gate insulating film 102b. By forming the insulating film 110a or the insulating film 110b in such a manner, the whole oxide semiconductor film 108 can be covered; thus, oxygen can be supplied to the oxide semiconductor film 108 and the interface of the oxide semiconductor film 108 effectively which lead to reduction of oxygen deficiency.

Through the above process, the transistor 120 is formed.

Note that the above description is an example of performing oxygen doping treatment on the oxide semiconductor film 108 which is processed into the island-shaped oxide semiconductor film 108 and is highly purified; however, one embodiment of the disclosed invention is not limited to this. For example, the oxide semiconductor film may be highly purified and subjected to the oxygen doping treatment and then, may be processed into an island-shaped oxide semiconductor film; or the oxygen doping treatment may be performed after formation of the source electrode 104a and the drain electrode 104b.

<Modified Example of Semiconductor Device>

FIGS. 3A to 3F show cross-sectional views of a transistor 130, a transistor 140, a transistor 150, a transistor 125, a transistor 135, and a transistor 145 as modified examples of the transistor 120 shown in FIGS. 1A to 1C.

Figure 3A:
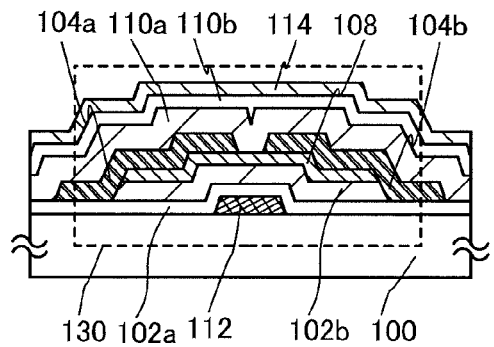
FIGS. 3A to 3F are views each illustrating one embodiment of a semiconductor device.

The transistor 130 shown in FIG. 3A is the same as the transistor 120 in that it includes the gate electrode 112, the gate insulating film 102a, the gate insulating film 102b, the oxide semiconductor film 108, the source electrode 104a, the drain electrode 104b, the insulating film 110a, and the insulating film 110b, which are formed over the substrate 100. The difference between the transistor 130 and the transistor 120 is the presence of the insulating film 114 covering the above components. That is, the transistor 130 includes the insulating film 114. The other components are the same as those of the transistor 120 in FIGS. 1A to 1C; thus, the description on FIGS. 1A to 1C can be referred to for the details.

Note that the insulating film 114 can be formed using silicon oxide, silicon nitride, aluminum oxide, aluminum nitride, or gallium oxide, a mixed material thereof, or the like. In particular, a silicon nitride film is preferable as the insulating film 114 because added oxygen can be prevented from being released to the outside and entry of hydrogen and the like to the oxide semiconductor film 108 from the outside can be suppressed effectively. The hydrogen content of the insulating film 114 is less than or equal to $1/10$ of that of the nitrogen content thereof, and is preferably less than $1\times10^{20}$ cm$^{-3}$, more preferably less than $5\times10^{18}$ cm$^{-3}$. Note that a wiring connected to the source electrode 104a, the drain electrode 104b, the gate electrode 112, and the like may be formed in the insulating film 114.

Figure 3D:
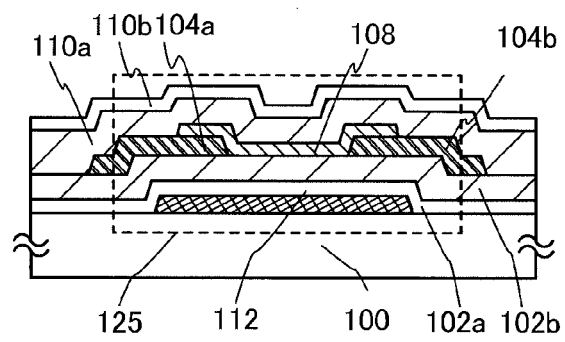
Figure 3B:
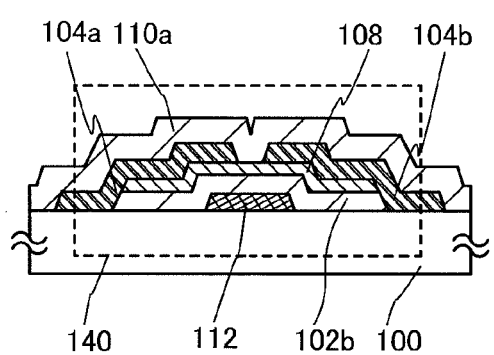

The transistor 140 shown in FIG. 3B is the same as the transistor 120 in that it includes the gate electrode 112, the gate insulating film 102b, the oxide semiconductor film 108, the source electrode 104a, the drain electrode 104b, and the insulating film 110a, which are formed over the substrate 100. The difference between the transistor 140 and the transistor 120 is the gate insulating film and the insulating film over the oxide semiconductor film 108. In other words, the gate insulating film of the transistor 140 is formed only with the gate insulating film 102b containing an insulating material which contains a component similar to that of the oxide semiconductor film. The insulating film over the oxide semiconductor film 108 of the transistor 140 is formed only with the insulating film 110a containing an insulating material which contains a component similar to that of the oxide semiconductor film. The other components are the same as those of the transistor 120 in FIGS. 1A to 1C; thus, the description on FIGS. 1A to 1C can be referred to for the details.

Note that when the transistor 140 is formed, the gate insulating film 102b is formed over the gate electrode 112, and then the halogen doping treatment is performed on the gate insulating film 102b, so that halogen is contained in the gate insulating film 102b. These steps are different from the steps shown in FIGS. 2A and 2B. The electronegativity of halogen such as chlorine and fluorine is larger than that of a metal (Zn, Ga, and In) in the oxide semiconductor film 108, so that a hydrogen atom can be taken away from M—H bond in the oxide semiconductor film 108 by containing halogen in the gate insulating film 102b. Thus, a hydrogen ion detached from M—H bond in the oxide semiconductor film 108 which causes deterioration of a transistor can be trapped by halogen such as chlorine and fluorine added at the interface between the oxide semiconductor film 108 and the gate insulating film 102b.

Figure 3E:
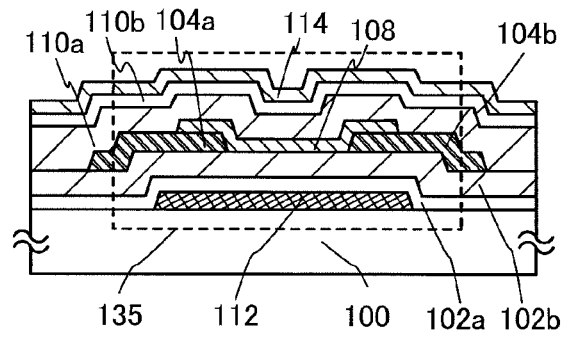
Figure 3C:
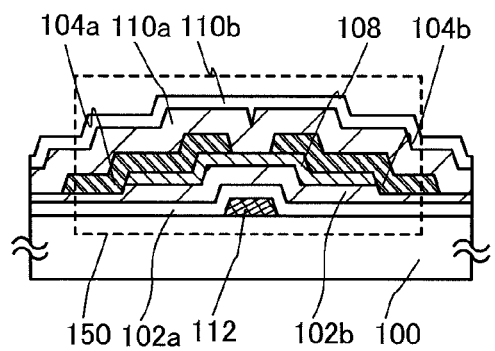

The transistor 150 shown in FIG. 3C is the same as the transistor 120 in FIGS. 1A to 1C in that it includes the above components. The difference between the transistor 150 and the transistor 120 is that whether the gate insulating film 102b is processed into the island-shaped gate insulating film 102b or not. That is, the gate insulating film 102b of the transistor 120 is processed into the island-shaped gate insulating film 102b. In contrast, the gate insulating film 102b of the transistor 140 is not processed into the island-shaped gate insulating film 102b. In some cases, the thickness of a region in the gate insulating film 102b which is not overlapped with the oxide semiconductor film 108 becomes smaller than that of a region in the gate insulating film 102b which is overlapped with the oxide semiconductor film 108, depending on the etching selectivity of the oxide semiconductor film 108 and the gate insulating film 102b. The other components are the same as those in FIGS. 1A to 1C.

The transistor 125 shown in FIG. 3D is the same as the transistor 120 shown in FIGS. 1A to 1C in that it includes the above components. The difference between the transistor 125 and the transistor 120 is the stacking sequence of the source electrode 104a, the drain electrode 104b, and the oxide semiconductor film 108. In other words, in the transistor 120, the oxide semiconductor film 108 is formed before the source electrode 104a and the drain electrode 104b are formed, whereas in the transistor 125, the source electrode 104a and the drain electrode 104b are formed before the oxide semiconductor film 108 is formed. The other components are the same as those in FIGS. 1A to 1C.

The transistor 135 shown in FIG. 3E has a structure similar to that of the transistor 125 shown in FIG. 3D, and includes the insulating film 114 like the transistor 130.

Figure 3F:
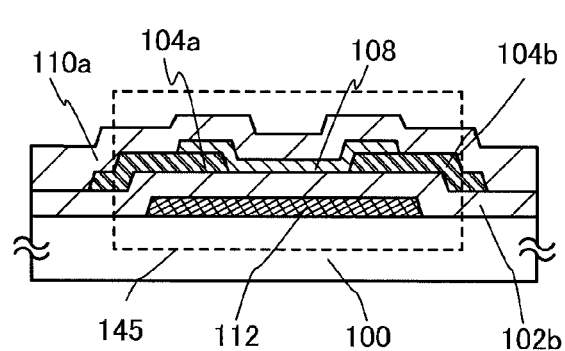

The transistor 145 shown in FIG. 3F has a structure similar to that of the transistor 125 shown in FIG. 3D. The gate insulating film of the transistor 145 is formed only with the gate insulating film 102b containing an insulating material which contains a component similar to that of the oxide semiconductor film like the transistor 140. The insulating film over the oxide semiconductor film 108 of the transistor 145 is formed only with the insulating film 110a containing an insulating material which contains a component similar to that of the oxide semiconductor film like the transistor 140.

Note that the structure of each transistor described above can be combined with each other as appropriate.

The transistor according to this embodiment includes an oxide semiconductor film highly purified to be electrically i-type (intrinsic) by removing impurities such as hydrogen, water, a hydroxyl group, and hydride (also referred to as a hydrogen compound) from the oxide semiconductor and supplying oxygen which might be reduced in a step of removing impurities, through heat treatment. The transistor including the oxide semiconductor film highly purified in such a manner has electrical characteristics such as the threshold voltage, which are less likely to change, and thus is electrically stable.

In particular, when the oxygen content in the oxide semiconductor film is increased by oxygen doping treatment, deterioration due to electrical bias stress or heat stress can be suppressed and deterioration due to light can be reduced.

Moreover, halogen typified by chlorine is added to the gate insulating film where the oxide semiconductor film is formed by halogen doping treatment, so that deterioration due to electrical bias stress or heat stress can be suppressed and deterioration due to light can be reduced.

As described above, according to one embodiment of the disclosed invention, a highly reliable transistor can be provided.

The structures, methods, and the like described in this embodiment can be combined as appropriate with any of the structures and methods described in the other embodiments.

(Embodiment 2)

In this embodiment, a semiconductor device and a method for manufacturing the semiconductor device will be described with reference to FIGS. 4A to 4C, FIGS. 5A to 5F, and FIGS. 6A to 6F.

<Example of Structure of Semiconductor Device>

Figure 4A:
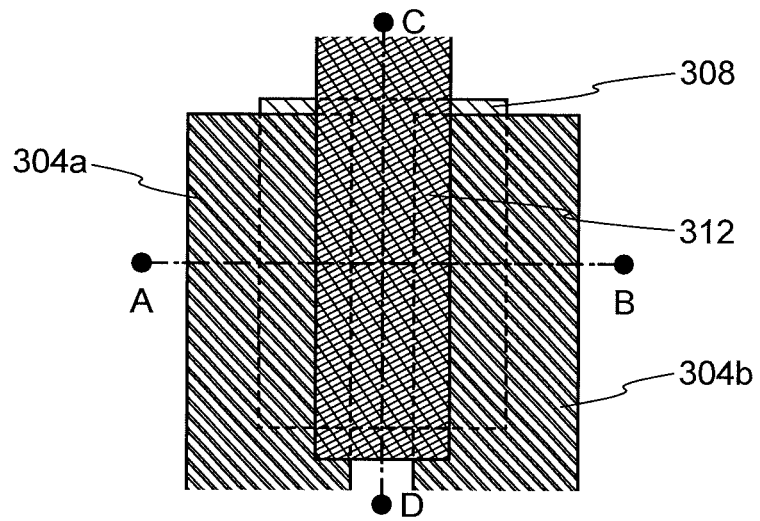
FIGS. 4A to 4C are views illustrating one embodiment of a semiconductor device.
Figure 4B:
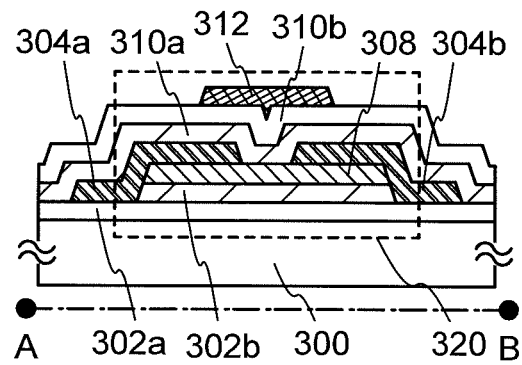
Figure 4C:
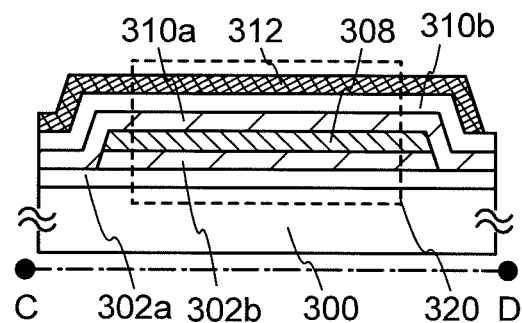

A structural example of a transistor 320 is shown in FIGS. 4A to 4C. Here, FIG. 4A is a plan view, FIG. 4B is a cross-sectional view along A-B of FIG. 4A, and FIG. 4C is a cross-sectional view along C-D of FIG. 4A. Note that in FIG. 4A, part of components of the transistor 320 (for example, a gate insulating film 310a, a gate insulating film 310b) are omitted for brevity.

The transistor 320 shown in FIGS. 4A to 4C includes an insulating film 302a, an insulating film 302b, an oxide semiconductor film 308, a source electrode 304a, a drain electrode 304b, the gate insulating film 310a, the gate insulating film 310b, and a gate electrode 312, which are formed over a substrate 300.

In the transistor 320 shown in FIGS. 4A to 4C, the oxide semiconductor film 308 is an oxide semiconductor film subjected to oxygen doping treatment. The transistor 320 having high reliability is realized by performing oxygen doping treatment.

Moreover, halogen doping treatment is performed on the insulating film 302a in the transistor 320 shown in FIGS. 4A to 4C. The transistor 320 having higher reliability is realized by such halogen doping treatment.

<Example of Manufacturing Steps of Semiconductor Device>

Hereinafter, an example of manufacturing steps of the semiconductor device shown in FIGS. 4A to 4C is described with reference to FIGS. 5A to 5F.

Figure 5A:
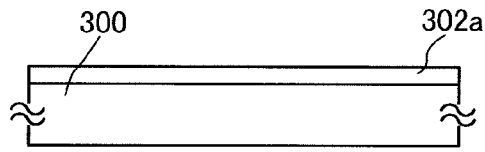
FIGS. 5A to 5F are views illustrating one embodiment of a method for manufacturing a semiconductor device.

First, the insulating film 302a is formed over the substrate 300 (see FIG. 5A).

There is no particular limitation on the property of a material and the like of the substrate 300 as long as the material has heat resistance high enough to withstand at least heat treatment performed later. For example, a glass substrate, a ceramic substrate, a quartz substrate, or a sapphire substrate can be used as the substrate 300. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 300. Still alternatively, any of these substrates further provided with a semiconductor element may be used as the substrate 300.

A flexible substrate may be used as the substrate 300. In the case where a transistor is provided over a flexible substrate, the transistor can be directly formed over the flexible substrate. Alternatively, the transistor may be formed over a different substrate, separated from the substrate, and then transferred to the flexible substrate. In order to separate the transistor to transfer it to the flexible substrate, a separation layer is preferably formed between the different substrate and the transistor.

It is preferable to use an insulating material containing a material different from that of the oxide semiconductor film formed later, for the insulating film 302a. The insulating film 302a can be formed using a single layer or a stacked layer of silicon oxide, silicon nitride, silicon oxynitride, silicon nitride oxide, aluminum oxide, aluminum nitride, aluminum oxynitride, aluminum nitride oxide, or hafnium oxide, or a mixed material thereof, by a plasma CVD method, a sputtering method, or the like. Note that a sputtering method or the like is appropriate in terms of low possibility of entry of hydrogen, water, and the like.

Figure 5B:
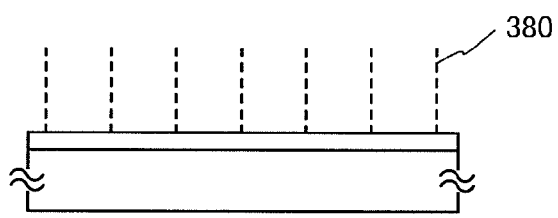

Next, treatment by halogen 380 (also referred to as halogen doping treatment or halogen plasma doping treatment) is performed on the insulating film 302a, whereby halogen is contained in the insulating film 302a (see FIG. 5B). Chlorine, fluorine, or the like can be used as the halogen 380. Since the electronegativity of halogen such as chlorine and fluorine is large, a hydrogen ion which causes deterioration in a transistor can be trapped. Hydrogen in the insulating film 302a can be fixed and prevented from diffusing into the oxide semiconductor film 308 from the insulating film 302a by containing halogen, such as chlorine, to the insulating film 302a over which the oxide semiconductor film 308 is formed. Consequently, deterioration in the characteristics of a transistor is suppressed or reduced even when light irradiation is performed on the transistor or BT stress is applied thereto.

Here, since the atomic radius of chlorine is larger than that of fluorine and the diffusion coefficient of chlorine is smaller than that of fluorine, a hydrogen ion is easily fixed in the insulating film 302a by chlorine. In particular, when heat treatment is performed later, chlorine is less likely to move compared to fluorine; therefore, a hydrogen ion can be trapped more effectively. Consequently, chlorine is preferably used as the halogen 380. In this embodiment, chlorine is used as the halogen 380. In the case where chlorine is used as the halogen 380, at least any of a chlorine radical, a chlorine atom, and a chlorine ion is included in the halogen 380.

The above-described halogen 380 can be generated by a plasma generating apparatus and an ozone generating apparatus. Specifically, for example, the insulating film 302a can be processed by generating the halogen 380 using an apparatus capable of performing etching treatment on a semiconductor device, an apparatus capable of performing ashing on a resist mask, or the like. Note that addition of halogen is preferably performed under a condition that damage to a surface of the insulating film 302a is minimized.

In order to add halogen more preferably, a substrate may be electrically biased. Halogen can be deeply added to the insulating film 302a by increasing the bias applied to the substrate.

In the case where chlorine is added using an inductively coupled plasma (ICP) apparatus, it is preferable to apply high frequency power supply of 1 kW or more and 10 kW or less to an ICP coil that is a plasma generation source, and to keep a state where the plasma is generated for a certain period (30 seconds or more and 600 seconds or less). For example, chlorine doping treatment may be performed under a condition that ICP power is 6000 W, bias power is 250 W, chlorine gas flow rate is 500 sccm, pressure of a treatment chamber is 1.3 Pa, and treatment time is 60 seconds.

Halogen may be added by performing irradiation with a halogen ion accelerated by an electric field.

Oxygen may be added at the same time as halogen typified by chlorine.

Figure 5C:
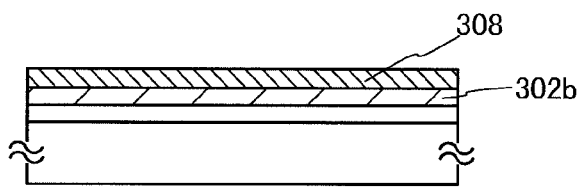

Next, the insulating film 302b functioning as a base is formed over the insulating film 302a (see FIG. 5C).

For the insulating film 302b, it is particularly preferable to use an insulating material containing a component similar to that of the oxide semiconductor film formed later. Such a material is compatible with the oxide semiconductor film; thus, when it is used for the insulating film 302b, the state of the interface between the oxide semiconductor film and the insulating film 302b can be kept favorably. Here, "a component similar to that of the oxide semiconductor film" means one or more of metal elements selected from constituent metal elements of the oxide semiconductor film. For example, in the case where the oxide semiconductor film is constituted of an In—Ga—Zn—O-based oxide semiconductor material, gallium oxide or the like can be given as the insulating material containing a constituent similar to that of the oxide semiconductor film.

Further, as shown in FIG. 5C, the insulating film which functions as a base is more preferably a stacked-layer structure of the insulating film 302a containing a material different from that of the oxide semiconductor film and the insulating film 302b containing an insulating material which contains a component similar to that of the oxide semiconductor film. Charges are preferentially trapped in charge trapping centers at the interface between the insulating film 302a and the insulating film 302b (compared to the interface between the oxide semiconductor film and the insulating film 302b) by stacking the insulating film 302a, the insulating film 302b, and the oxide semiconductor film in this order. Thus, charges can be satisfactorily prevented from being trapped at the interface between the oxide semiconductor film and the insulating film 302b, whereby reliability of the semiconductor device is increased. In addition, charges can be more preferentially trapped in the charge trapping centers at the interface between the insulating film 302a and the insulating film 302b by performing the above-described halogen doping treatment on the insulating film 302a.

As such a stacked-layer structure of the insulating films 302a and 302b, a stacked-layer structure of a gallium oxide film and a silicon oxide film, a stacked-layer structure of a gallium oxide film and a silicon nitride film, or the like can be applied.

Note that the insulating film functioning as a base of the transistor 320 shown in FIGS. 4A to 4C has a stacked-layer structure of the insulating film 302a containing a material different from that of the oxide semiconductor film and the insulating film 302b containing an insulating material which contains a component similar to that of the oxide semiconductor film; however, the structure of the insulating film is not limited to this. For example, the insulating film which functions as a base may be formed of either of the insulating film 302a containing a material different from that of the oxide semiconductor film or the insulating film 302b containing an insulating material which contains a component similar to that of the oxide semiconductor film.

Next, the oxide semiconductor film 308 is formed over the insulating film 302b (see FIG. 5C).

The oxide semiconductor film is preferably formed by a method in which hydrogen, water, or the like does not easily enter the oxide semiconductor film. For example, the oxide semiconductor film can be formed by a sputtering method or the like. The thickness of the oxide semiconductor film is desirably 3 nm or more and 30 nm or less. This is because the transistor might be normally on when the oxide semiconductor film is too thick (e.g., the thickness is 50 nm or more).

For example, an oxide semiconductor material containing indium, an oxide semiconductor material containing indium and gallium, or the like can be given as a material used for the oxide semiconductor film.

As a material used for the oxide semiconductor film, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; a single-component metal oxide such as an In—O-based material, a Sn—O-based material, or a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

The oxide semiconductor film may be a thin film formed using a material expressed by the chemical formula, $InMO_3(ZnO)_m$ (m>0). Here, M represents one or more metal elements selected from Ga, Al, Mn, and Co. For example, M may be Ga, Ga and Al, Ga and Mn, Ga and Co, or the like.

In this embodiment, the oxide semiconductor film is formed by a sputtering method using an In—Ga—Zn—O-based oxide semiconductor deposition target.

As an In—Ga—Zn—O-based oxide semiconductor deposition target, for example, an oxide semiconductor deposition target having a composition ratio of $In_2O_3:Ga_2O_3:ZnO=1:1:1$ [molar ratio] can be used. Note that it is not necessary to limit the material and the composition ratio of the target to the above. For example, an oxide semiconductor deposition target having a composition ratio of $In_2O_3:Ga_2O_3:ZnO=1:1:2$ [molar ratio] can also be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the oxide semiconductor deposition target is set to 90% or more and 100% or less, preferably 95% or more and 99.9% or less. With the use of an oxide semiconductor deposition target with high filling rate, a dense oxide semiconductor film can be formed.

A deposition atmosphere may be a rare gas (typically argon) atmosphere, an oxygen atmosphere, a mixed atmosphere of a rare gas and oxygen, or the like. Further, the deposition atmosphere is desirably an atmosphere using a high-purity gas from which impurities containing hydrogen atoms such as hydrogen, water, a hydroxyl group, and hydride are satisfactorily removed, in order to prevent hydrogen, water, a hydroxyl group, and hydride from entering the oxide semiconductor film.

More specifically, for example, the oxide semiconductor film can be formed as follows.

First, the substrate 300 is placed in a deposition chamber kept under reduced pressure, and the substrate temperature is set to a temperature of 100° C. or higher and 600° C. or lower, preferably 200° C. or higher and 400° C. or lower. This is because when deposition is performed in the state where the substrate 300 is heated, the concentration of impurities contained in the oxide semiconductor film can be reduced. Moreover, damage due to sputtering can be reduced.

Then, a high-purity gas from which impurities containing hydrogen atoms such as hydrogen and water are satisfactorily removed is introduced into the deposition chamber while remaining moisture is being removed, and the oxide semiconductor film is formed over the substrate 300 with the use of the above target. In order to remove moisture remaining in the deposition chamber, an entrapment vacuum pump such as a cryopump, an ion pump, or a titanium sublimation pump is desirably used. The evacuation unit may be a turbo molecular pump provided with a cold trap. In the deposition chamber which is evacuated with the cryopump, a hydrogen molecule, a compound containing a hydrogen atom, such as water ($H_2O$), (more preferably, also a compound containing a carbon atom), and the like are removed, whereby the concentration of impurities contained in the oxide semiconductor film formed in the deposition chamber can be reduced.

As an example of the deposition condition, the distance between the substrate and the target can be set to 100 mm; the pressure, 0.6 Pa; the direct-current (DC) power supply, 0.5 kW; and the deposition atmosphere, an oxygen atmosphere (the flow rate of the oxygen is 100%). Note that a pulsed direct-current power source is preferable because powder substances (also referred to as particles or dust) generated in deposition can be reduced and the film thickness can be uniform.

Then, the oxide semiconductor film 308 is subjected to heat treatment. Excessive hydrogen (including water and a hydroxyl group) in the oxide semiconductor film 308 is removed through this heat treatment and the structure of the oxide semiconductor film is modified, so that defect levels in an energy gap can be reduced. The heat treatment is performed at 250° C. or higher and 650° C. or lower, preferably 450° C. or higher and 600° C. or lower, or lower than the strain point of the substrate.

For example, an object to be heated is introduced into an electric furnace using a resistance heating element or the like, and the heat treatment is performed in a nitrogen atmosphere at 450° C. for an hour. The oxide semiconductor film 308 is not exposed to the air during the heat treatment so that entry of water and hydrogen can be prevented.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, heat treatment using the GRTA apparatus may be performed as follows. The object to be processed is put in a heated inert gas atmosphere, heated for several minutes, and taken out of the inert gas atmosphere. The GRTA process enables high-temperature heat treatment for a short time. The GRTA process can be employed even when the temperature exceeds the upper temperature limit of the object to be processed. Note that the inert gas may be switched to a gas containing oxygen during the process. This is because a defect level in an energy gap caused by oxygen deficiency can be reduced by performing the heat treatment in the atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or more, preferably 7 N (99.99999%) or more (that is, the concentration of the impurities is 1 ppm or less, preferably 0.1 ppm or less).

The above heat treatment can be referred to as dehydration treatment, dehydrogenation treatment, or the like because of its advantageous effect of removing hydrogen, water, and the like. The dehydration treatment or dehydrogenation treatment may be performed at the timing, for example, after the oxide semiconductor film is processed into an island-shaped oxide semiconductor film. Such dehydration treatment or dehydrogenation treatment may be conducted once or plural times. In addition, hydrogen or the like entered the insulating film 302a and the like through the halogen doping treatment can be removed by this heat treatment.

Figure 5D:
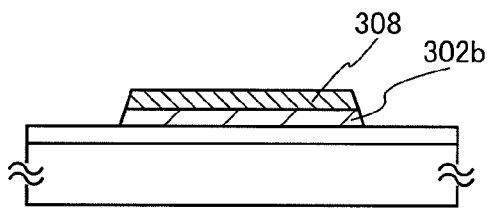

Next, the oxide semiconductor film 308 is processed into the island-shaped oxide semiconductor film 308 (see FIG. 5D).

The oxide semiconductor film 308 can be processed by being etched after a mask having a desired shape is formed over the oxide semiconductor film. The mask can be formed by a method such as photolithography. The mask may be alternatively formed by a method such as an inkjet method.

At this time, the insulating film 302b containing an insulating material which contains a component similar to that of the oxide semiconductor film 308 may be etched with the oxide semiconductor film 308, and may be processed to have island shape.

The oxide semiconductor film 308 and the insulating film 302b may be etched by either wet etching or dry etching. It is needless to say that both of them may be used in combination.

Note that the oxide semiconductor film 308 is not necessarily processed to have island shape.

Figure 5E:
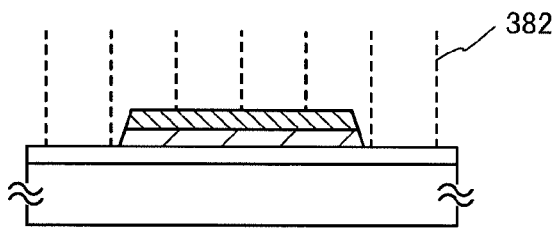

Next, the oxide semiconductor film 308 is subjected to treatment using an oxygen 382 (also referred to as oxygen doping treatment and oxygen plasma doping treatment) (see FIG. 5E). Here, at least any of an oxygen radical, an oxygen atom, and an oxygen ion is included in the oxygen 382. By performing oxygen doping treatment on the oxide semiconductor film 308, the oxygen can be contained either or both in the oxide semiconductor film 308 or/and in the vicinity of the interface of the oxide semiconductor film 308. In this case, the oxygen content is greater than the stoichiometric proportion of the oxide semiconductor film 308, preferably greater than the stoichiometric proportion and less than twice the stoichiometric proportion. Alternatively, the oxygen content may be greater than Y, preferably greater than Y and less than 2Y, where the oxygen amount in the case where a material of the oxide semiconductor film is single-crystalline is Y. Still alternatively, the oxygen content may be greater than Z, preferably greater than Z and less than 2Z based on the oxygen amount Z of the oxide semiconductor film in the case where oxygen doping treatment is not performed. The reason why the above preferable range has the upper limit is that hydrogen might be taken up by the oxide semiconductor film 308 like a hydrogen-storing alloy when the oxygen content is too high. Note that in the oxide semiconductor film, the oxygen content is higher than the hydrogen content.

In the case of a material whose crystalline structure is expressed by $InGaO_3(ZnO)_m$ (m>0), x in $InGaZn_2O_x$ can be greater than 4 and less than 8 when the crystalline structure where m is 1 ($InGaZnO_4$) is used as the reference, and x in $InGaZn_2O_x$ can be greater than 5 and less than 10 when the crystalline structure where m is 2 ($InGaZn_2O_5$) is used as the reference. Such an excessive oxygen region may exist in part of the oxide semiconductor (including the interface).

In the oxide semiconductor film, oxygen is one of the main component materials. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Incidentally, it is known that oxygen contains isotopes such as $^{17}O$ and $^{18}O$ and the proportions of $^{17}O$ and $^{18}O$ in all of the oxygen atoms in nature is about 0.037% and about 0.204%, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes in some cases. Thus, the concentrations of these isotopes may be measured to determine whether oxygen is intentionally added to the oxide semiconductor film.

For example, when the concentration of $^{18}O$ is used as the reference, it can be said that D1 ($^{18}O$)>D2 ($^{18}O$) is satisfied between the concentration of an isotope of oxygen D1 ($^{18}O$) in a region of the oxide semiconductor film, which has been added with oxygen, and the concentration of an isotope of oxygen D2 ($^{18}O$) in a region of the oxide semiconductor film, which is not been doped with oxygen.

It is preferable that at least part of the oxygen 382 added to the oxide semiconductor film have dangling bonds in the oxide semiconductor film. This is because such dangling bonds are linked with hydrogen remaining in the film so that hydrogen can be fixed (made to be immobile ions).

The oxygen 382 can be generated by a plasma generating apparatus or an ozone generating apparatus. Specifically, for example, the oxygen 382 is generated using an apparatus capable of performing etching on a semiconductor device, an apparatus capable of performing ashing on a resist mask, or the like, and the oxide semiconductor film 308 can be processed. Alternatively, the oxygen may be added by performing irradiation with an oxygen ion accelerated by an electric field.

Note that it is desirable to apply an electrical bias to the substrate in order to perform oxygen doping more favorably.

Note that the heat treatment is desirably performed on the oxide semiconductor film 308 after being subjected to the oxygen doping treatment. The heat treatment temperature is 250° C. or higher and 700° C. or lower, preferably 400° C. or higher and 600° C. or lower, or lower than the strain point of the substrate.

Water, hydroxide (OH), or the like generated by the reaction of oxygen and an oxide semiconductor material can be removed from the oxide semiconductor film by this heat treatment. Hydrogen or the like entered the oxide semiconductor film 308 or the like due to the above oxygen doping treatment can also be removed by this heat treatment. The heat treatment may be performed in an atmosphere from which water, hydrogen, or the like is satisfactorily reduced, such as a nitrogen atmosphere, an oxygen atmosphere, an ultra-dry air atmosphere (the moisture amount is 20 ppm (−55° C. by conversion into a dew point) or less, preferably 1 ppm or less, more preferably 10 ppb or less when measured with the use of a dew point meter of a cavity ring down laser spectroscopy (CRDS) system), or a rare gas atmosphere (such as argon and helium). In particular, the heat treatment is preferably performed in an atmosphere containing oxygen. Alternatively, nitrogen, oxygen, or a rare gas introduced into the heat treatment apparatus preferably has a purity of 6N (99.9999%) or more (that is, concentration of impurities is 1 ppm or less), more preferably 7N (99.99999%) or more (that is, concentration of impurities is 0.1 ppm or less).

The oxygen doping treatment and the heat treatment may be performed repeatedly. Reliability of the transistor can be more improved by performing the treatments repeatedly. Note that the number of repetition times can be set as appropriate.

In the heat treatment according to this embodiment, the oxide semiconductor film 308 is desirably heated in an atmosphere containing oxygen. Consequently, oxygen which might be reduced by the above dehydration treatment (or dehydrogenation treatment) can be supplied to the oxide semiconductor film 308. From this aspect, the heat treatment can be referred to as supply of oxygen.

Note that there is no particular limitation on the timing of the heat treatment for supply of oxygen as long as it is after formation of the oxide semiconductor film 308. For example, the heat treatment for supply of oxygen may be performed after formation of the gate insulating film 310a described later. Alternatively, the heat treatment for supply of oxygen may be performed after the gate electrode is formed. Still alternatively, the heat treatment for supply of oxygen may be performed following the heat treatment for dehydration or the like, the treatment for dehydration or the like may also serve as the heat treatment for supply of oxygen, or the treatment for supply of oxygen may also serve as the heat treatment for dehydration or the like.

As described above, the heat treatment for dehydration or the like and oxygen doping treatment or the heat treatment for supply of oxygen are applied, whereby the oxide semiconductor film 308 can be highly purified so as to contain impurities other than main components of the oxide semiconductor film 308 as little as possible. The highly purified oxide semiconductor film 308 contains extremely few (close to zero) carriers derived from a donor. Impurities are reduced by the heat treatments so that an i-type (intrinsic) or substantially i-type oxide semiconductor film is obtained. Consequently, a transistor having highly excellent characteristics can be realized.

Note that in this embodiment, the heat treatment for dehydration or the like is performed, the oxide semiconductor film 308 is processed into the island-shaped oxide semiconductor film 308, the oxygen doping treatment is performed, and the heat treatment for supply of oxygen is performed; however, these steps are not limited to this order.

Figure 5F:
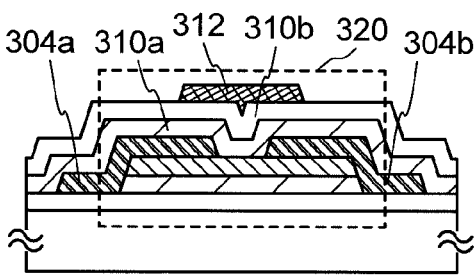

Next, a conductive film for forming the source electrode and the drain electrode (including a wiring formed in the same layer as the source electrode and the drain electrode) is formed over the insulating film 302a, the insulating film 302b, and the oxide semiconductor film 308 and processed to form the source electrode 304a and the drain electrode 304b (see FIG. 5F). The channel length L of the transistor depends on the distance between the edges of the source electrode 304a and the drain electrode 304b which are formed here.

As the conductive film used for the source electrode 304a and the drain electrode 304b, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like may be used. Alternatively, a conductive film may be used in which a high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like.

Alternatively, the conductive film used for the source electrode 304a and the drain electrode 304b may be formed using a conductive metal oxide. As the conductive metal oxide, an indium oxide ($In_2O_3$), a tin oxide ($SnO_2$), a zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials containing a silicon oxide may be used.

The conductive film may be processed by etching with the use of a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

An etching step may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask, resulting in simplification of the steps.

Next, the gate insulating film 310a being in contact with part of the oxide semiconductor film 308 and covering the source electrode 304a and the drain electrode 304b, and the gate insulating film 310b covering the source electrode 304a and the drain electrode 304b are formed (see FIG. 5F).

The gate insulating film 310a can be formed in a similar manner to the insulating film 302b. That is, it is particularly preferable to use an insulating material containing a component similar to that of the oxide semiconductor film 308 for the gate insulating film 310a. Such a material is compatible with the oxide semiconductor film; thus, when it is used for the gate insulating film 310a, the state of the interface between the oxide semiconductor film 308 and the gate insulating film 310a can be kept favorably. In the case where the oxide semiconductor film 308 is formed of an In—Ga—Zn—O-based oxide semiconductor material, gallium oxide or the like is given as the insulating material containing a component similar to that of the oxide semiconductor film 308, for example.

Further, the gate insulating film 310a preferably contains much oxygen that exceeds the stoichiometric proportion, more preferably contains oxygen more than 1 time and less than two times the stoichiometric proportion. When the gate insulating film 310a thus contains excessive oxygen, oxygen is supplied to the oxide semiconductor film 308 and the interface between the gate insulating film 310a and the oxide semiconductor film 308, so that oxygen deficiency can be reduced.

The gate insulating film 310b can be formed in a similar manner to the insulating film 302a. That is, the gate insulating film 310b can be formed using a single layer or a stacked layer of silicon oxide, silicon nitride, silicon oxynitride, silicon nitride oxide, aluminum oxide, aluminum nitride, aluminum oxynitride, aluminum nitride oxide, or hafnium oxide, or a mixed material thereof. Considering that the gate insulating film 310b functions as a gate insulating film of a transistor, a material having a high dielectric constant such as hafnium oxide, tantalum oxide, yttrium oxide, hafnium silicate (Hf-Si$_x$O$_y$ (x>0, y>0)), hafnium aluminate (HfAl$_x$O$_y$ (x>0, y>0)), hafnium silicate to which nitrogen is added, hafnium aluminate to which nitrogen is added may be employed.

Further, the gate insulating film 310b preferably contains much oxygen that exceeds the stoichiometric proportion, more preferably contains oxygen more than 1 time and less than two times the stoichiometric proportion. When the gate insulating film 310b thus contains excessive oxygen, oxygen is supplied to the oxide semiconductor film 308 and the interface between the gate insulating film 310b and the oxide semiconductor film 308, so that oxygen deficiency can be reduced.

Here, it is preferable to employ a stacked-layer structure of the gate insulating film 310a containing an insulating material which contains a component similar to that of the oxide semiconductor film and the gate insulating film 310b containing a material different from that of the oxide semiconductor film. Charges are preferentially trapped in charge trapping centers at the interface between the gate insulating film 310a and the gate insulating film 310b (compared to the interface between the oxide semiconductor film and the gate insulating film 310a) by stacking the oxide semiconductor film 308, the gate insulating film 310b, and the gate insulating film 310a in this order. Thus, charges can be satisfactorily prevented from being trapped at the interface between the oxide semiconductor film and the gate insulating film 310a, whereby reliability of the semiconductor device is increased.

As such a stacked-layer structure of the gate insulating films 310a and 310b, a stacked-layer structure of a gallium oxide film and a silicon oxide film, a stacked-layer structure of a gallium oxide film and a silicon nitride film, or the like can be applied.

Note that the insulating film of the transistor 320 shown in FIGS. 4A to 4C has a stacked-layer structure of the gate insulating film 310a containing an insulating material which contains a component similar to that of the oxide semiconductor film and the gate insulating film 310b containing a material different from that of the oxide semiconductor film; however, the structure of the insulating film is not limited to this. For example, the insulating film may be formed of either of the gate insulating film 310a containing an insulating material which contains a component similar to that of the oxide semiconductor film and the gate insulating film 310b containing a material different from that of the oxide semiconductor film.

Note that it is preferable to form the gate insulating film 310a or the gate insulating film 310b so as to be in contact with the insulating film 302a or the insulating film 302b. By forming the gate insulating film 310a or the gate insulating film 310b in such a manner, the whole oxide semiconductor film 308 can be covered; thus, oxygen can be supplied to the oxide semiconductor film 308 and the interface of the oxide semiconductor film 308 effectively which lead to reduction of oxygen deficiency.

A high-density plasma CVD method using microwaves (e.g., with a frequency of 2.45 GHz) is preferably employed for forming the gate insulating films 310a and 310b because an insulating layer which is formed can be dense and can have high breakdown voltage and high quality. This is because when a highly purified oxide semiconductor is closely in contact with a high-quality gate insulating film, the interface state can be reduced and interface properties can be favorable.

Then, the gate electrode 312 is formed in a region over the gate insulating film 310b overlapping with the oxide semiconductor film 308 (see FIG. 5F). The gate electrode 312 can be formed by a plasma CVD method, a sputtering method, or the like. The gate electrode 312 can be formed to have a single-layer structure or a stack-layer structure using a metal material such as molybdenum, titanium, tantalum, tungsten, aluminum, copper, neodymium, or scandium, or an alloy material which contains any of these materials as a main component.

Through the above steps, the transistor 320 is formed.

Note that the above description is an example of performing oxygen doping treatment on the oxide semiconductor film 308 which is processed into the island-shaped oxide semiconductor film 308 and is highly purified; however, one embodiment of the disclosed invention is not limited to this. For example, the oxide semiconductor film may be highly purified and subjected to the oxygen doping treatment and then, may be processed into an island-shaped oxide semiconductor film; or the oxygen doping treatment may be performed after formation of the source electrode 304a and the drain electrode 304b.

<Modified Example of Semiconductor Device>

FIGS. 6A to 6F show cross-sectional views of a transistor 330, a transistor 340, a transistor 350, a transistor 325, a transistor 335, and a transistor 345 as modified examples of the transistor 320 shown in FIGS. 4A to 4C.

Figure 6A:
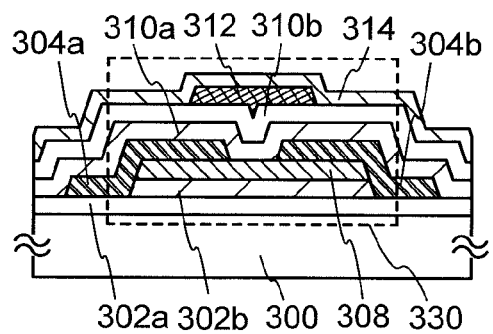
FIGS. 6A to 6F are views each illustrating one embodiment of a semiconductor device.

The transistor 330 shown in FIG. 6A is the same as the transistor 320 in that it includes the insulating film 302a, the insulating film 302b, the oxide semiconductor film 308, the source electrode 304a, the drain electrode 304b, the gate insulating film 310a, the gate insulating film 310b, and the gate electrode 312, which are formed over the substrate 300. The difference between the transistor 330 and the transistor 320 is the presence of the insulating film 314 covering the above components. That is, the transistor 330 includes the insulating film 314. The other components are the same as those of the transistor 320 in FIGS. 4A to 4C; thus, the description on FIGS. 4A to 4C can be referred to for the details.

Note that the insulating film 314 can be formed using silicon oxide, silicon nitride, aluminum oxide, aluminum nitride, or gallium oxide, a mixed material thereof, or the like. In particular, a silicon nitride film is preferable as the insulating film 314 because added oxygen can be prevented from being released to the outside and entry of hydrogen and the like to the oxide semiconductor film 308 from the outside can be suppressed effectively. The hydrogen content of the insulating film 314 is less than or equal to 1/10 of that of the nitrogen content thereof, and is preferably less than $1\times10^{20}$ cm$^{-3}$, more preferably less than $5\times10^{18}$ cm$^{-3}$. Note that a wiring connected to the source electrode 304a, the drain electrode 304b, the gate electrode 312, and the like may be formed in the insulating film 314.

Figure 6D:
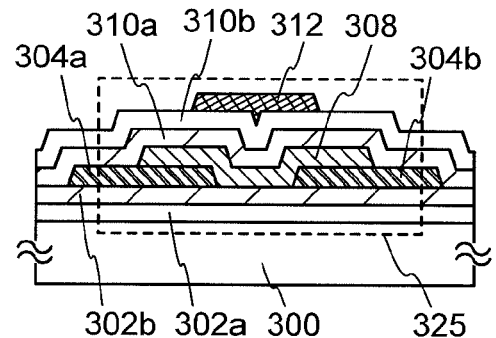
Figure 6B:
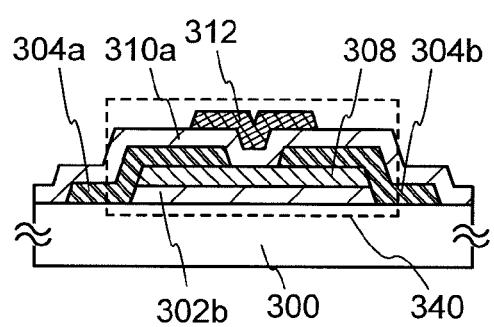

The transistor 340 shown in FIG. 6B is the same as the transistor 320 in that it includes the insulating film 302b, the oxide semiconductor film 308, the source electrode 304a, the drain electrode 304b, the gate insulating film 310a, and the gate electrode 312, which are formed over the substrate 300. The difference between the transistor 340 and the transistor 320 is the insulating film functioning as a base and the gate insulating film. In other words, the insulating film functioning as a base of the transistor 340 is formed only with the insulating film 302b containing an insulating material which contains a component similar to that of the oxide semiconductor film. The gate insulating film of the transistor 340 is formed only with the gate insulating film 310a containing an insulating material which contains a component similar to that of the oxide semiconductor film. The other components are the same as those of the transistor 320 in FIGS. 4A to 4C; thus, the description on FIGS. 4A to 4C can be referred to for the details.

Note that when the transistor 340 is formed, the insulating film 302b is formed over the substrate 300, and then the halogen doping treatment is performed on the insulating film 302b, so that halogen is contained in the insulating film 302b. These steps are different from the steps shown in FIGS. 5A and 5B. The electronegativity of halogen such as chlorine and fluorine is larger than that of a metal (Zn, Ga, and In) in an oxide semiconductor film 308, so that a hydrogen atom can be taken away from M—H bond in the oxide semiconductor film 308 by containing halogen in the insulating film 302b. Thus, a hydrogen ion detached from M—H bond in the oxide semiconductor film 308 which causes deterioration of a transistor can be trapped by halogen such as chlorine and fluorine added at an interface between the oxide semiconductor film 308 and the insulating film 302b.

Figure 6E:
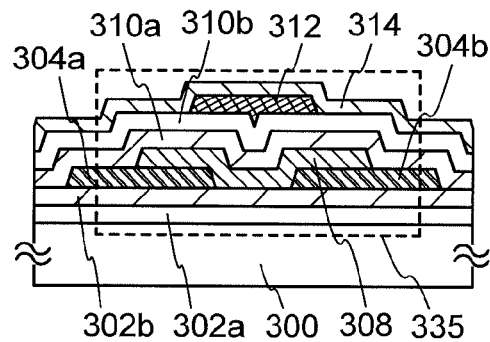
Figure 6C:
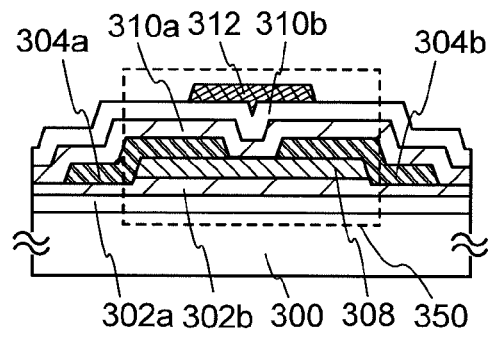

The transistor 350 shown in FIG. 6C is the same as the transistor 320 shown in FIGS. 4A to 4C in that it includes the above components. The difference between the transistor 350 and the transistor 320 is that whether the insulating film 302b is processed into the island-shaped insulating film 302b or not. That is, the insulating film 302b of the transistor 320 is processed into the island-shaped insulating film 302b. In contrast, the insulating film 302b of the transistor 340 is not processed into the island-shaped insulating film 302b. In some cases, the thickness of a region in the insulating film 302b which is not overlapped with the oxide semiconductor film 308 becomes smaller than that of a region in the insulating film 302b which is overlapped with the oxide semiconductor film 308, depending on the etching selectivity of the oxide semiconductor film 308 and the insulating film 302b. The other components are the same as those in FIGS. 4A to 4C.

The transistor 325 shown in FIG. 6D is the same as the transistor 320 shown in FIGS. 4A to 4C in that it includes the above components. The difference between the transistor 325 and the transistor 320 is the stacking sequence of the source electrode 304a, the drain electrode 304b, and the oxide semiconductor film 308. In other words, in the transistor 320, the oxide semiconductor film 308 is formed before the source electrode 304a and the drain electrode 304b are formed, whereas in the transistor 325, the source electrode 304a and the drain electrode 304b are formed before the oxide semiconductor film 308 is formed. The other components are the same as those in FIGS. 4A to 4C.

The transistor 335 shown in FIG. 6E has a structure similar to that of the transistor 325 shown in FIG. 6D, and includes the insulating film 314 like the transistor 330.

Figure 6F:
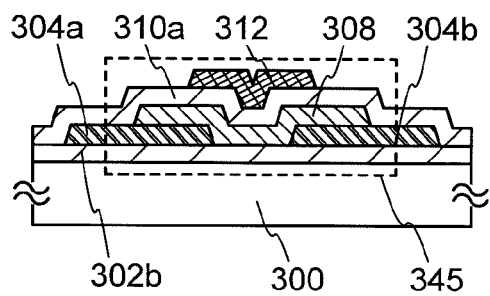

The transistor 345 shown in FIG. 6F has a structure similar to that of the transistor 325 shown in FIG. 6D. The insulating film functioning as a base of the transistor 345 is formed only with the insulating film 302b containing an insulating material which contains a component similar to that of the oxide semiconductor film like the transistor 340. The gate insulating film of the transistor 345 is formed only with the gate insulating film 310a containing an insulating material which contains a component similar to that of the oxide semiconductor film like the transistor 340.

Note that the structure of each transistor described above can be combined with each other as appropriate.

The transistor according to this embodiment includes an oxide semiconductor film highly purified to be electrically i-type (intrinsic) by removing impurities such as hydrogen, water, a hydroxyl group, and hydride (also referred to as a hydrogen compound) from the oxide semiconductor and supplying oxygen which might be reduced in a step of removing impurities, through heat treatment. The transistor including the oxide semiconductor film highly purified in such a manner has electrical characteristics such as the threshold voltage, which are less likely to change, and thus is electrically stable.

In particular, when the oxygen content in the oxide semiconductor film is increased by oxygen doping treatment, deterioration due to electrical bias stress or heat stress can be suppressed and deterioration due to light can be reduced.

Moreover, halogen typified by chlorine is added to the insulating film where the oxide semiconductor film is formed by halogen doping treatment, so that deterioration due to electrical bias stress or heat stress can be suppressed and deterioration due to light can be reduced.

As described above, according to one embodiment of the disclosed invention, a highly reliable transistor can be provided.

The structures and methods described in this embodiment can be combined as appropriate with any of the structures and methods described in the other embodiments.
(Embodiment 3)

In this embodiment, an example of a plasma apparatus (also referred to as an ashing apparatus) which can be used for oxygen doping treatment or halogen doping treatment will be described. Note that the apparatus is industrially suitable as compared to an ion implantation apparatus or the like because the apparatus can be applicable for a large-sized glass substrate of the fifth generation or later, for example.

Figure 17A:
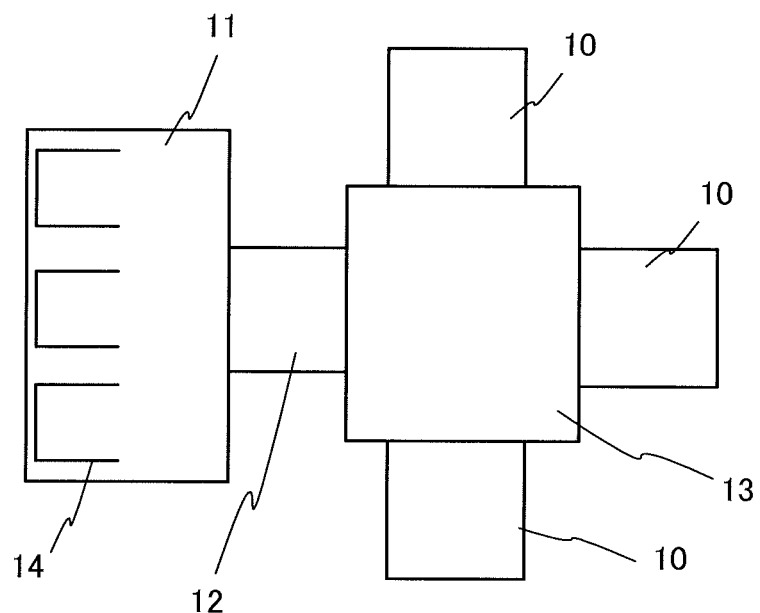
FIGS. 17A and 17B are a top view and a cross-sectional view of a plasma apparatus, respectively.
Figure 17B:
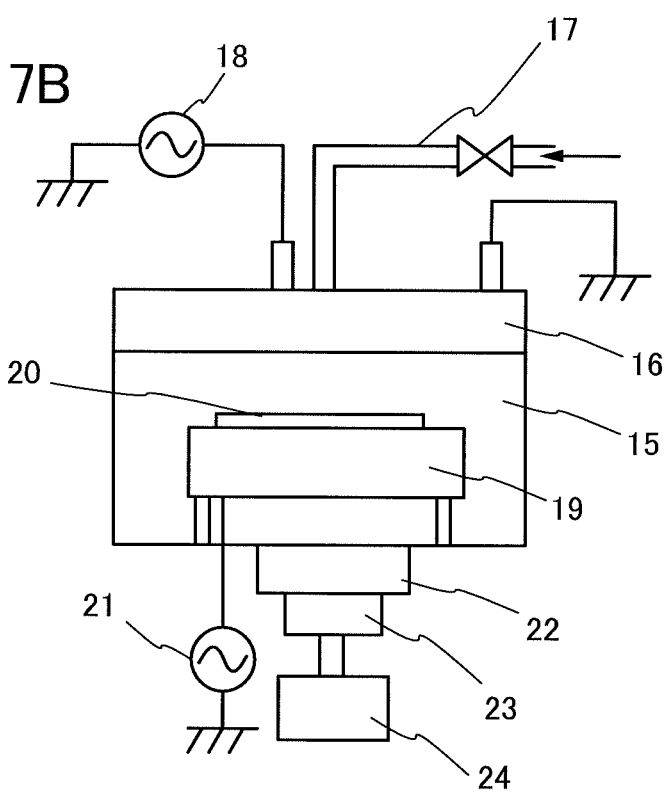

FIG. 17A shows an example of a top view of a single wafer multi-chamber equipment. FIG. 17B shows an example of a cross-sectional view of a plasma apparatus (also referred to as an ashing apparatus) used for oxygen plasma doping.

The single wafer multi-chamber equipment shown in FIG. 17A includes three plasma apparatuses 10 each of which corresponds to FIG. 17B, a substrate supply chamber 11 including three cassette ports 14 for holding a process substrate, a load lock chamber 12, a transfer chamber 13, and the like. A substrate supplied to the substrate supply chamber is transferred through the load lock chamber 12 and the transfer chamber 13 to a vacuum chamber 15 in the plasma apparatus and is subjected to oxygen plasma doping. The substrate which has been subjected to oxygen plasma doping is transferred from the plasma apparatus, through the load lock chamber and the transfer chamber, to the substrate supply chamber. Note that a transfer robot for transferring a process substrate is provided in each of the substrate supply chamber 11 and the transfer chamber 13.

Referring to FIG. 17B, the plasma apparatus 10 includes the vacuum chamber 15. A plurality of gas outlets and an ICP coil (an inductively coupled plasma coil) 16 which is a generation source of plasma are provided on a top portion of the vacuum chamber 15.

The twelve gas outlets are arranged in a center portion, seen from the top of the plasma apparatus 10. Each of the gas outlets is connected to a gas supply source for supplying an oxygen gas, through a gas flow path 17. The gas supply source includes a mass flow controller and the like and can supply an oxygen gas to the gas flow path 17 at a desired flow rate (which is greater than 0 sccm and 1000 sccm or less). The oxygen gas supplied from the gas supply source is supplied from the gate flow path 17, through the twelve gas outlets, into the vacuum chamber 15.

The ICP coil 16 includes a plurality of strip-like conductors each of which has a spiral form. One end of each of the conductors is electrically connected to a first high-frequency power source 18 (13.56 MHz) through a matching circuit for controlling impedance, and the other end thereof is grounded.

A substrate stage 19 functioning as a bottom electrode is provided in a lower portion of the vacuum chamber. By an electrostatic chuck or the like provided for the substrate stage 19, a process substrate 20 is held on the substrate stage so as to be detachable. The substrate stage 19 is provided with a heater as a heating system and a He gas flow path as a cooling system. The substrate stage is connected to a second high-frequency power source 21 (3.2 MHz) for applying a substrate bias voltage.

In addition, the vacuum chamber 15 is provided with an exhaust port and an automatic pressure control valve (also referred to as an APC) 22. The APC is connected to a turbo molecular pump 23 and further, connected to a dry pump 24 through the turbo molecular pump 23. The APC controls the inside pressure of the vacuum chamber. The turbo molecular pump 23 and the dry pump 24 reduce the inside pressure of the vacuum chamber 15.

Next, described is an example in which plasma is generated in the vacuum chamber 15 shown in FIG. 17B, and oxygen plasma doping is performed on an oxide semiconductor film, a base insulating film, or a gate insulating film provided for the process substrate 20.

First, the inside pressure of the vacuum chamber 15 is held at a desired pressure by operating the turbo molecular pump 23, the dry pump 24, and the like, and then, the process substrate 20 is installed on the substrate stage in the vacuum chamber 15. Note that the process substrate 20 held over the substrate stage includes at least an oxide semiconductor film or a base insulating film. In this embodiment, the inside pressure of the vacuum chamber 15 is held at 1.33 Pa. Note that a flow rate of the oxygen gas supplied from the gas outlets into the vacuum chamber 15 is set at 250 sccm.

Next, a high-frequency power is applied from the first high-frequency power source 18 to the ICP coil 16, thereby generating plasma. Then, a state in which plasma is being generated is kept for a certain period (30 seconds or more and 600 seconds or less). Note that the high-frequency power applied to the ICP coil 16 is 1 kW or more and 10 kW or less. In this embodiment, the high-frequency power is set at 6000 W. At this time, a substrate bias voltage may be applied from the second high-frequency power source 21 to the substrate stage. In this embodiment, power used for applying the substrate bias voltage is set at 1000 W.

In this embodiment, the state in which plasma is being generated is kept for 60 seconds and then, the process substrate 20 is transferred from the vacuum chamber 15. In this manner, oxygen plasma doping can be performed on the oxide semiconductor film, the base insulating film, or the gate insulating film provided for the process substrate 20.

Note that halogen doping treatment can be performed with the use of a halogen gas such as chlorine and fluorine using an apparatus similar to the above described apparatus.

The structures, the methods, and the like described in this embodiment can be combined as appropriate with any of the structures, the methods, and the like described in the other embodiments.

(Embodiment 4)

In this embodiment, as an example of a semiconductor device, a memory medium (a memory element) will be described. In this embodiment, the transistor including an oxide semiconductor described in Embodiments 1, 2, or the like and a transistor including a material other than an oxide semiconductor are formed over one substrate.

Figure 7A:
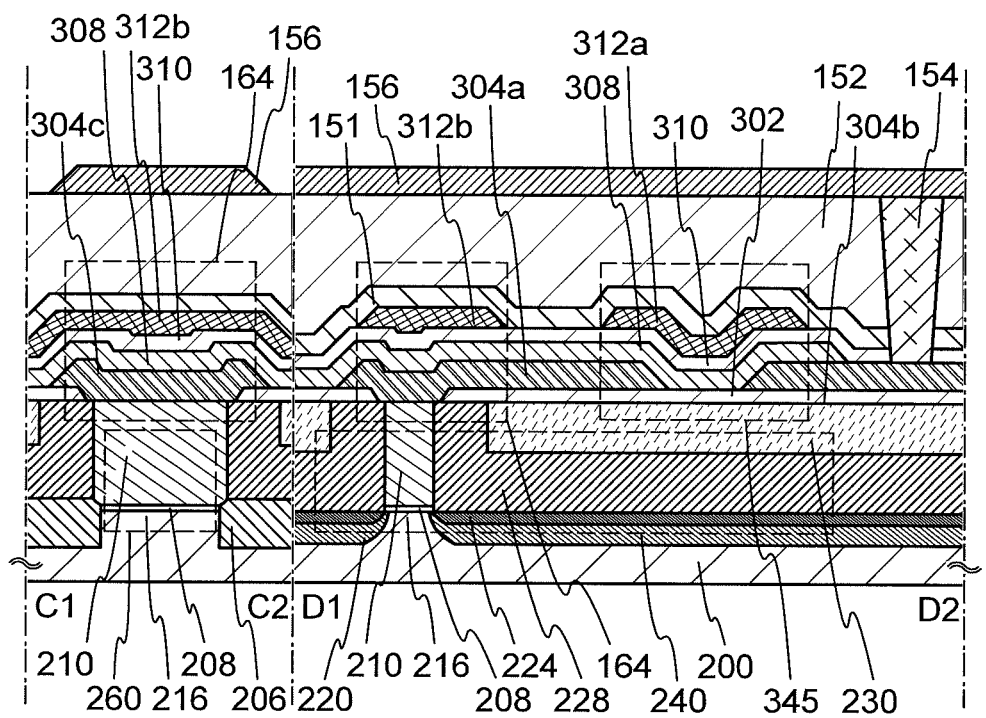
FIGS. 7A to 7C are a cross-sectional view, a top view, and a circuit diagram of a semiconductor device, respectively.
Figure 7B:
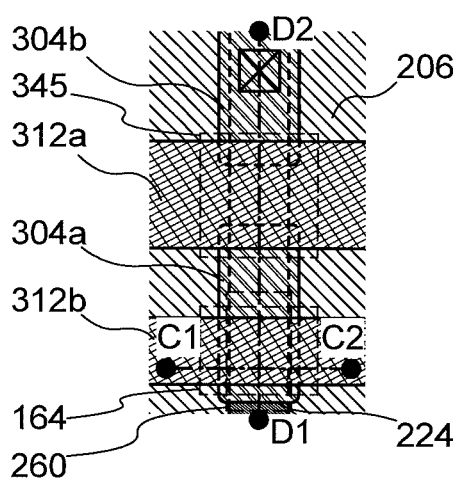
Figure 7C:
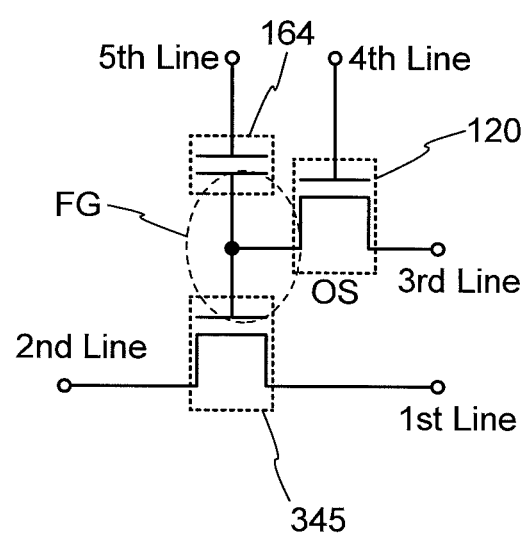

FIGS. 7A to 7C illustrate an example of a structure of a semiconductor device. FIG. 7A is a cross-sectional view of the semiconductor device, and FIG. 7B is a plan view of the semiconductor device. Here, FIG. 7A corresponds to a cross-sectional view along C1-C2 and D1-D2 of FIG. 7B. In addition, FIG. 7C illustrates an example of a diagram of a circuit including the semiconductor device as a memory element. In the semiconductor device illustrated in FIGS. 7A and 7B, a transistor 240 including a first semiconductor material is provided in a lower portion, and the transistor 345 described in Embodiment 2 is provided in an upper portion. Note that the transistor 345 includes a second semiconductor material as an oxide semiconductor. In this embodiment, the first semiconductor material is a semiconductor material other than an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material other than an oxide semiconductor can operate at high speed easily. On the other hand, a transistor including an oxide semiconductor can hold charge for a long time owing to its characteristics.

Note that in this embodiment, an example in which the memory medium is formed using the transistor 345 is described; however, needless to say, any of the transistors described in Embodiment 1 or Embodiment 2 can be used instead of the transistor 345.

The transistor 240 in FIGS. 7A to 7C includes a channel formation region 216 provided in a substrate 200 including a semiconductor material (e.g., silicon), impurity regions 220 provided so as to sandwich the channel formation region 216, metal compound regions 224 in contact with the impurity regions 220, a gate insulating film 208 provided over the channel formation region 216, and the gate electrode 210 provided over the gate insulating film 208.

As the substrate 200 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film including a material other than silicon is provided over an insulating surface. In other words, a semiconductor film included in the "SOI substrate" is not limited to a silicon semiconductor film. Moreover, the SOI substrate can be a substrate in which a semiconductor film is provided over an insulating substrate such as a glass substrate with an insulating film provided therebetween.

An element isolation insulating film 206 is provided over the substrate 200 so as to surround the transistor 240, and an insulating film 228 and an insulating film 230 are provided to cover the transistor 240. Note that for high integration, it is preferable that, as in FIG. 7A, the transistor 240 does not have a sidewall insulating film. On the other hand, in the case where the characteristics of the transistor 240 have priority, sidewall insulating films may be provided on side surfaces of the gate electrode 210, and the impurity regions 220 may each include a region with a different impurity concentration.

The transistor 240 can be manufactured using silicon, germanium, silicon germanium, silicon carbide, gallium arsenide, or the like. Such a transistor 240 is capable of high speed operation. Thus, when the transistor is used as a reading transistor, data can be read out at high speed.

After the transistor 240 is formed, as treatment prior to the formation of the transistor 345 and a capacitor 164, the insulating film 228 and the insulating film 230 are subjected to CMP treatment so that a top surface of the gate electrode 210 is exposed. As treatment for exposing the top surface of the gate electrode 210, etching treatment, or the like can also be employed instead of CMP treatment; in order to improve characteristics of the transistor 345, surfaces of the insulating film 228 and the insulating film 230 are desirably made as flat as possible.

Next, the insulating film 302 which functions as a base and is in contact with the oxide semiconductor film 308 is formed. The insulating film 302 can be formed using the insulating film 302a, the insulating film 302b, or a stacked-layer structure of the insulating films 302a and 302b described in Embodiment 2, and the material and the formation process described in Embodiment 2.

Next, a conductive film is formed over the gate electrode 210, the insulating film 228, the insulating film 230, and the like and the conductive film is selectively etched, so that the source electrode 304a and the drain electrode 304b are formed.

The conductive film can be formed by a PVD method such as a sputtering method or a CVD method such as a plasma CVD method. As the material of the conductive film, an element selected from Al, Cr, Cu, Ta, Ti, Mo, and W, an alloy including any of the above elements as its component, or the like can be used. Any of Mn, Mg, Zr, Be, Nd, and Sc, or a material including any of these in combination may be used.

The conductive film may have either a single-layer structure or a stacked-layer structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive film has a single-layer structure of a titanium film or a titanium nitride film, there is an advantage that the source electrode 304a and the drain electrode 304b can be easily processed to be tapered.

A channel length (L) of the transistor 345 in the upper portion is determined by a distance between a lower end portion of the source electrode 304a and a lower end portion of the drain electrode 304b. Note that for light exposure for forming a mask used in the case where a transistor with a channel length (L) of less than 25 nm is formed, it is desirable to use extreme ultraviolet whose wavelength is as short as several nanometers to several tens of nanometers.

Next, an oxide semiconductor film is formed to cover the source electrode 304a and the drain electrode 304b, and the oxide semiconductor film is selectively etched, so that the oxide semiconductor film 308 is formed. The oxide semiconductor film is formed using the material and the formation process described in Embodiment 2.

Then, a gate insulating film 310 in contact with the oxide semiconductor film 308 is formed. The gate insulating film 310 is formed using the gate insulating film 310a, the gate insulating film 310b, or a stacked-layer of the insulating films 310a and 310b described in Embodiment 2, and the material and the formation process described in Embodiment 2.

Next, over the gate insulating film 310, a gate electrode 312a and an electrode 312b are formed so as to overlap with the oxide semiconductor film 308 and the source electrode 304a, respectively.

After the gate insulating film 310 is formed, heat treatment (also referred to as supply of oxygen) is desirably performed in an inert gas atmosphere or an oxygen atmosphere. The temperature of the heat treatment is 200° C. or higher and 450° C. or lower, desirably 250° C. or higher and 350° C. or lower. For example, the heat treatment may be performed at 250° C. for one hour in a nitrogen atmosphere. By performing the heat treatment, variation in electrical characteristics of the transistor can be reduced.

Note that the timing of the heat treatment for supplying oxygen is not limited thereto. For example, the heat treatment for supplying oxygen may be performed after the gate electrode is formed. Alternatively, heat treatment for supplying oxygen may be performed following heat treatment for dehydration or the like; heat treatment for dehydration or the like may also serve as heat treatment for supplying oxygen; or heat treatment for supplying oxygen may also serve as heat treatment for dehydration or the like.

As described above, when heat treatment for dehydration or the like, and oxygen doping or heat treatment for supplying oxygen are performed, the oxide semiconductor film 308 can be highly purified so as to contain impurities except for main components of the oxide semiconductor film 308 as little as possible.

The gate electrode 312a and the electrode 312b can be formed in such a manner that a conductive film is formed over the gate insulating film 310 and then etched selectively.

Next, an insulating film 151 and an insulating film 152 are formed over the gate insulating film 310, the gate electrode 312a, and the electrode 312b. The insulating film 151 and the insulating film 152 can be formed by a sputtering method, a CVD method, or the like. The insulating film 151 and the insulating film 152 can be formed using a material including an inorganic insulating material such as a silicon oxide, a silicon oxynitride, a silicon nitride, a hafnium oxide, an aluminum oxide, or a gallium oxide.

Next, an opening reaching the drain electrode 304b is formed in the gate insulating film 310, the insulating film 151, and the insulating film 152. The opening is foamed by selective etching with the use of a mask or the like.

After that, an electrode 154 is formed in the opening, and a wiring 156 which is in contact with the electrode 154 is formed over the insulating film 152.

The electrode 154 can be formed in such a manner, for example, that a conductive film is formed in a region including the opening by a PVD method, a CVD method, or the like and then part of the conductive film is removed by etching, CMP, or the like.

The wiring 156 is formed in such a manner that a conductive film is formed by a PVD method such as a sputtering method or a CVD method such as a plasma CVD method, and then the conductive film is patterned. Further, as a material of the conductive film, an element selected from Al, Cr, Cu, Ta, Ti, Mo, and W, an alloy containing any of the above elements as its component, or the like can be used. Any of Mn, Mg, Zr, Be, Nd, and Sc, or a material including any of these in combination may be used. The details are the same as those of the source electrode 304a, the drain electrode 304b, or the like.

Through the above process, the transistor 345 and the capacitor 164 which include the highly purified oxide semiconductor film 308 are completed. The capacitor 164 includes the source electrode 304a, the oxide semiconductor film 308, the gate insulating film 310, and the electrode 312b.

Note that in the capacitor 164 in FIGS. 7A to 7C, insulation between the source electrode 304a and the electrode 312b can be sufficiently secured by stacking the oxide semiconductor film 308 and the gate insulating film 310. Needless to say, the capacitor 164 without the oxide semiconductor film 308 may be employed in order to secure sufficient capacitance. Further alternatively, the capacitor 164 may be omitted in the case where a capacitor is not needed.

FIG. 7C illustrates an example of a diagram of a circuit using the semiconductor device as a memory element. In FIG. 7C, one of a source electrode and a drain electrode of the transistor 345, one electrode of the capacitor 164, and a gate electrode of the transistor 240 are electrically connected to each other. A first wiring (1st Line, also referred to as a source line) is electrically connected to a source electrode of the transistor 240. A second wiring (2nd Line, also referred to as a bit line) is electrically connected to a drain electrode of the transistor 240. A third wiring (3rd Line, also referred to as a first signal line) is electrically connected to the other of the source electrode and the drain electrode of the transistor 345. A fourth wiring (4th Line, also referred to as a second signal line) is electrically connected to a gate electrode of the transistor 345. A fifth wiring (5th Line, also referred to as a word line) is electrically connected to the other electrode of the capacitor 164.

The transistor 345 including an oxide semiconductor has an extremely low off current; therefore, when the transistor 345 is turned off, the potential of a node (hereinafter, a node FG) where one of the source electrode and drain electrode of the transistor 345, one electrode of the capacitor 164, and the gate electrode of the transistor 240 are electrically connected to each other can be held for an extremely long time. The capacitor 164 facilitates holding of charge given to the node FG and reading of the held data.

When data is stored in the semiconductor device (writing), first, the potential of the fourth wiring is set to a potential at which the transistor 345 is turned on, whereby the transistor 345 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 345 is turned off, whereby the transistor 345 is turned off. This makes the node FG floating and the predetermined amount of charge remains held in the node FG. The predetermined amount of charge is thus accumulated and held in the node FG whereby the memory cell can store data.

Since the off current of the transistor 345 is extremely small, the charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read out (reading), while a predetermined potential (a fixed potential) is applied to the first wiring, an appropriate potential (a read-out potential) is applied to the fifth wiring, whereby the transistor 240 changes its state depending on the amount of charge held in the node FG. This is because, in general, when the transistor 240 is an n-channel transistor, an apparent threshold value $V_{th\_H}$ of the transistor 240 in the case where a high-level charge is held in the node FG is lower than an apparent threshold value $V_{th\_L}$ of the transistor 240 in the case where a low-level charge is held in the node FG. Here, an apparent threshold voltage refers to the potential of the fifth wiring, which is needed to turn on the transistor 240. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 240 is turned on. In the case where a low-level charge is given in writing, even when the potential of the fifth wiring is set to $V_0$ ($<V_{th\_L}$), the transistor 240 remains in an off state. In such a manner, by controlling the potential of the fifth wiring and determining whether the transistor 240 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 345 is turned on, whereby the transistor 345 is turned on. Consequently, the potential of the third wiring (a potential of new data) is applied to the node FG and the predetermined amount of charge is accumulated in the node FG. After that, the potential of the fourth wiring is set to a potential at which the transistor 345 is turned off, whereby the transistor 345 is turned off. Thus, charge of the new data is held in the node FG. In other words, while the predetermined amount of charge given in the first writing is held in the node FG the same operation (a second writing) as that in the first writing is performed, whereby the stored data can be overwritten.

The off current of the transistor 345 described in this embodiment can be sufficiently reduced by using the highly purified oxide and intrinsic semiconductor film 308. In addition, when the oxide semiconductor film 308 contains excessive oxygen, variation in the electrical characteristics of the transistor 345 is suppressed, so that the transistor which is electrically stable can be obtained. Moreover, halogen typified by chlorine is added to the gate insulating film where the oxide semiconductor film is formed by halogen doping treatment, so that deterioration due to electrical bias stress or heat stress can be suppressed and deterioration due to light can be reduced. Further, with the use of such a transistor, a highly reliable semiconductor device capable of holding stored data for an extremely long time can be obtained. Small variation in threshold voltage is required for a semiconductor device which stores multivalued data, and the transistor 345 is suitable for such a purpose.

In the semiconductor device described in this embodiment, the transistor 240 and the transistor 345 overlap with each other; therefore, the integration degree of the semiconductor device can be sufficiently high.

The structures, the methods, and the like described in this embodiment can be combined as appropriate with any of the structures, the methods, and the like described in the other embodiments.

(Embodiment 5)

A semiconductor device having a display function (also referred to as a display device) can be manufactured using any of the transistors exemplified in Embodiment 1 or 2. Moreover, part or all of driver circuits which include the transistor can be formed over a substrate where the pixel portion is formed, whereby a system-on-panel can be obtained.

Figure 8A:
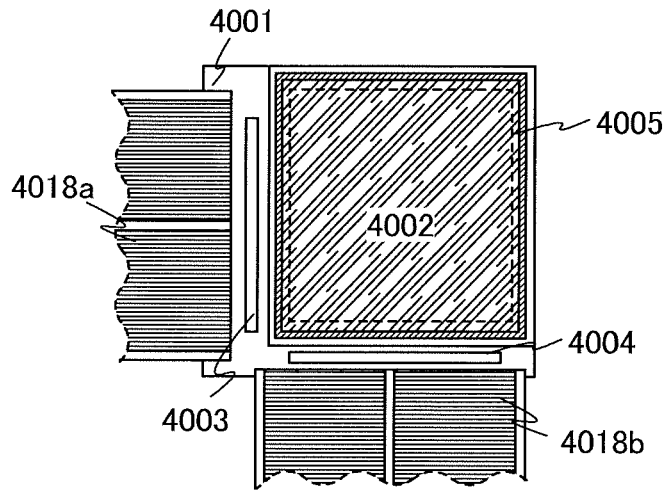
FIGS. 8A to 8C are views each illustrating one embodiment of a semiconductor device.

In FIG. 8A, a sealant 4005 is provided so as to surround a pixel portion 4002 provided over a first substrate 4001, and the pixel portion 4002 is sealed by using a second substrate 4006. In FIG. 8A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003 and the scan line driver circuit 4004 which are separately formed and the pixel portion 4002 from flexible printed circuits (FPCs) 4018a and 4018b.

Figure 8B:
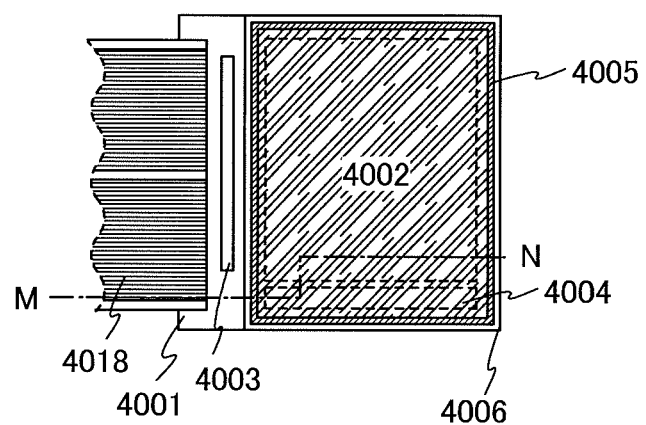
Figure 8C:
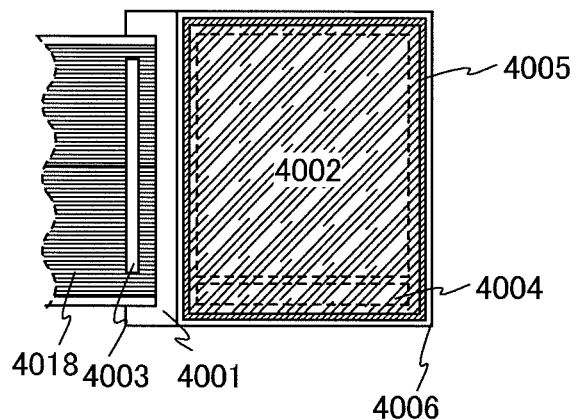

In FIGS. 8B and 8C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 8B and 8C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 8B and 8C, various signals and potential are supplied to the signal line driver circuit 4003 which is separately formed, the scan line driver circuit 4004, and the pixel portion 4002 from an FPC 4018.

Although FIGS. 8B and 8C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 8A shows an example in which the signal line driver circuit 4003 and the scan line driver circuit 4004 are mounted by a COG method. FIG. 8B shows an example in which the signal line driver circuit 4003 is mounted by a COG method. FIG. 8C shows an example in which the signal line driver circuit 4003 is mounted by a TAB method.

In addition, the display device includes a panel in which the display element is sealed, and a module in which an IC or the like including a controller is mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors which are described in Embodiment 1 or 2 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 9:
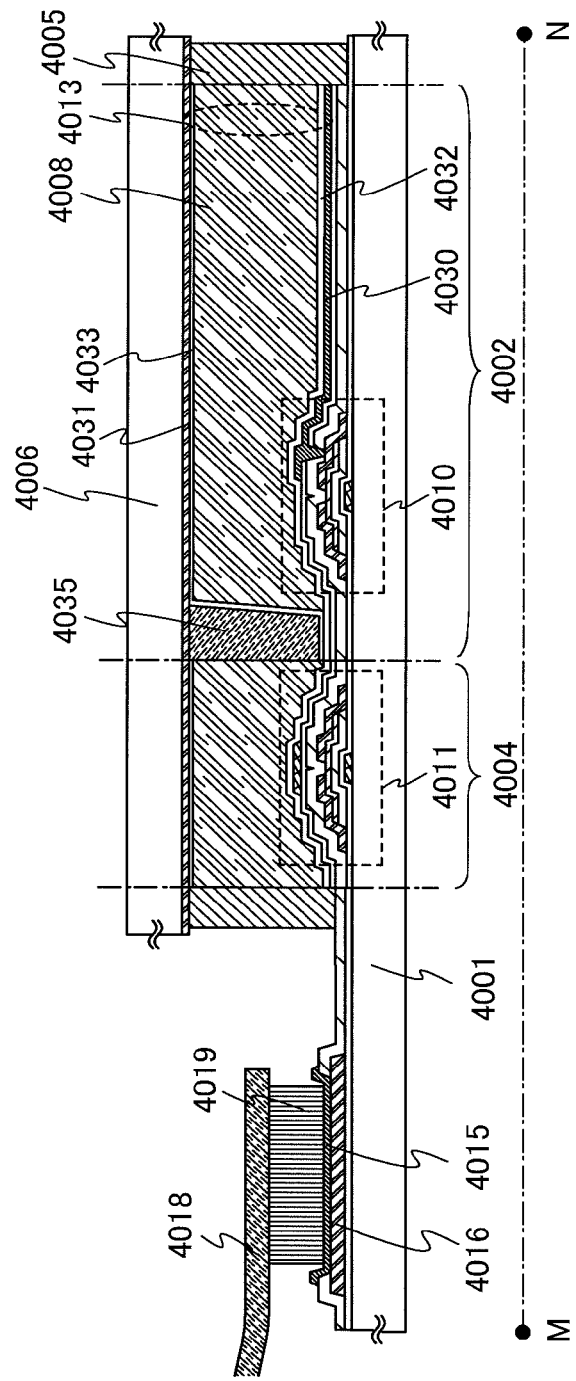
FIG. 9 is a view illustrating one embodiment of a semiconductor device.
Figure 10:
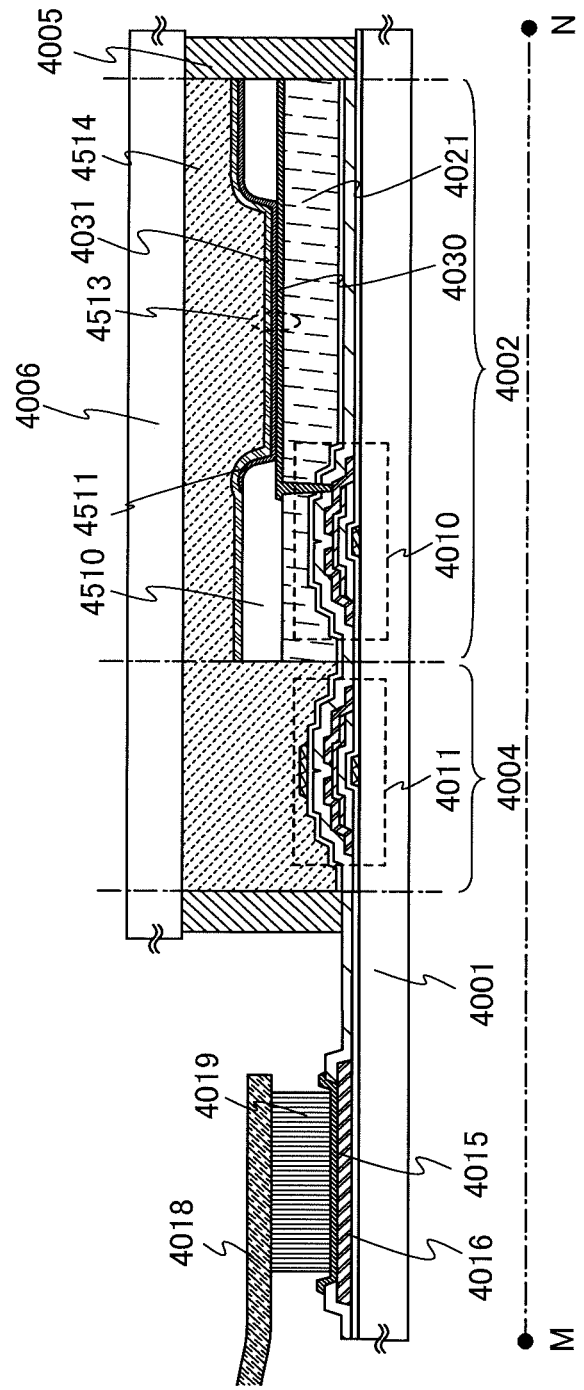
FIG. 10 is a view illustrating one embodiment of a semiconductor device.
Figure 11:
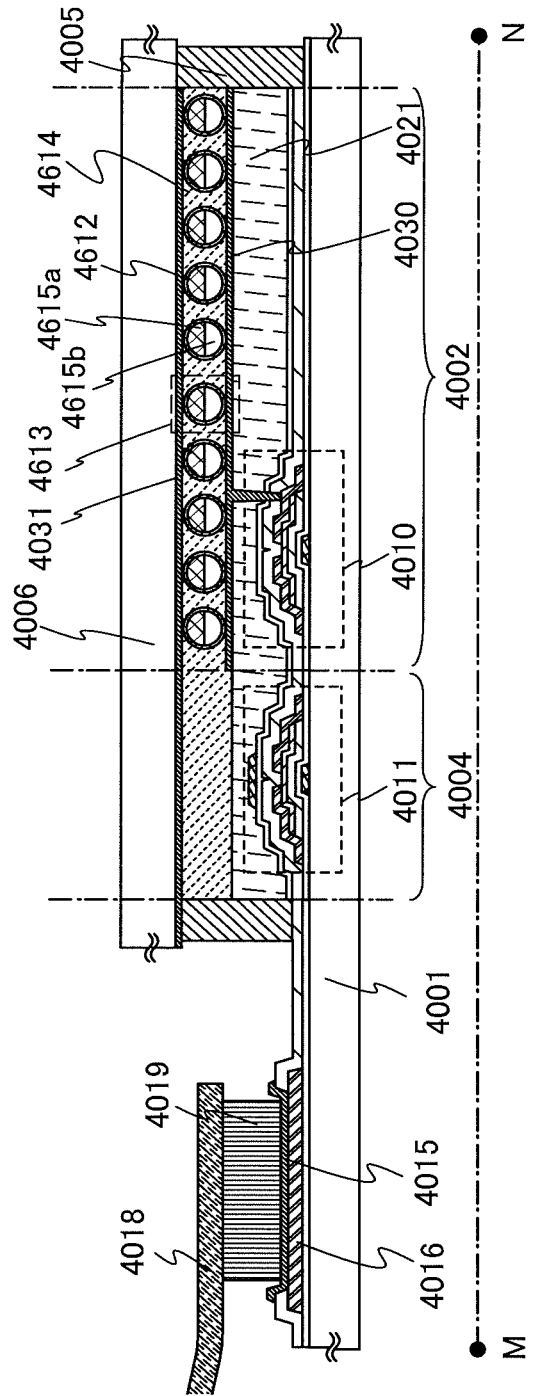
FIG. 11 is a view illustrating one embodiment of a semiconductor device.

An embodiment of the semiconductor device is described with reference to FIG. 9, FIG. 10, and FIG. 11. FIG. 9, FIG. 10, and FIG. 11 correspond to cross-sectional views taken along line M-N in FIG. 8B.

As shown in FIG. 9 to FIG. 11, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of a transistor 4010 and a transistor 4011.

The pixel portion 4002 and the scan line driver circuit 4004 which are provided over the first substrate 4001 include a plurality of transistors. In FIG. 9 to FIG. 11, the transistor 4010 included in the pixel portion 4002 and the transistor 4011 included in the scan line driver circuit 4004 are shown as an example. In FIG. 10 and FIG. 11, an insulating layer 4021 is provided over the transistor 4010 and the transistor 4011.

In this embodiment, the transistors described in Embodiment 1 or 2 can be applied to the transistor 4010 and the transistor 4011. Variation in electrical characteristics of the transistor 4010 and the transistor 4011 is suppressed and the transistor 4010 and the transistor 4011 are electrically stable. Therefore, highly reliable semiconductor devices can be provided as the semiconductor devices shown in FIG. 9 to FIG. 11.

In addition, in this embodiment, a conductive layer may be provided in a region over an insulating layer overlapping with a channel formation region of the oxide semiconductor film in the transistor 4011 for the driver circuit. By providing the conductive layer so as to overlap with the channel formation region of the oxide semiconductor film, the amount of change in the threshold voltage of the transistor 4011 before and after the BT test can be further reduced. The potential of the conductive layer may be the same as or different from that of a gate electrode of the transistor 4011. The conductive layer can also function as a second gate electrode layer. The potential of the conductive layer may be GND, 0V, or in a floating state.

Further, the conductive layer functions to block an external electric field, that is, to prevent an external electric field (particularly, to block static electricity) from effecting the inside (a circuit portion including a transistor). A blocking function of the conductive layer can prevent the variation in electrical characteristics of the transistor due to the effect of external electric field such as static electricity.

The transistor 4010 provided in the pixel portion 4002 is electrically connected to a display element, in a display panel. A variety of display elements can be used as the display element as long as display can be performed.

An example of a liquid crystal display device using a liquid crystal element as a display element is described in FIG. 9. In FIG. 9, a liquid crystal element 4013 which is a display element includes the first electrode layer 4030, the second electrode layer 4031, and a liquid crystal layer 4008. An insulating film 4032 and an insulating film 4033 which serve as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film and is provided in order to control the thickness (a cell gap) of the liquid crystal layer 4008. Note the spacer 4035 is not limited to a columnar spacer, and, for example, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ Ω·cm or more, preferably $1 \times 10^{11}$ Ω·cm or more, more preferably $1 \times 10^{12}$ Ω·cm or more. The value of the specific resistivity in this specification is measured at 20° C.

The size of storage capacitor formed in the liquid crystal display device is set considering the leakage current of the transistor provided in the pixel portion or the like so that charge can be held for a predetermined period. By using the transistor including the high-purity oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Consequently, an electrical signal such as an image signal can be held for a longer period in the pixel, and a writing interval can be set longer in an on state. Therefore, frequency of refresh operation can be reduced, which leads to an effect of suppressing power consumption.

The transistor including the highly purified oxide semiconductor film used in this embodiment can have relatively high field-effect mobility and thus can operate at high speed. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. For example, a multi-domain vertical alignment (MVA) mode, a patterned vertical alignment (PVA) mode, an advanced super view (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, and B (R, G; and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The transistor and the light-emitting element are provided over the substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as a display element will be shown in FIG. 10. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 10. The structure of the light-emitting element 4513 can be changed as appropriate depending on a direction in which light is extracted from the light-emitting element 4513, or the like. Intensity of current-excitation light emission is controlled by a drain current of a transistor; however, the drain current greatly varies when the threshold voltage of the transistor varies. Therefore, a transistor having small variation in the threshold voltage is required. The transistor shown in Embodiment 1 or 2 is suitable for this purpose.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is fanned as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a diamond like carbon (DLC) film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (one of which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates active matrix electronic paper as one embodiment of a semiconductor device. The electronic paper in FIG. 11 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 9 to FIG. 11, a flexible substrate as well as a glass substrate can be used as any of the first substrate 4001 and the second substrate 4006. For example, a plastic substrate having light-transmitting properties can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene-based resin, polyamide, or an epoxy resin is preferably used as a planarizing insulating film. As well as such organic insulating materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since the transistor is easily broken owing to static electricity or the like, a protective circuit for protecting the driver circuit is preferably provided. The protective circuit is preferably formed using a nonlinear element.

As described above, by using any of the transistors exemplified in Embodiment 1 or 2, a highly reliable semiconductor device can be provided.

This embodiment can be implemented in appropriate combination with any of the structures described in the other embodiments.

(Embodiment 6)

A semiconductor device having an image sensor function for reading data of an object can be formed with the use of any of the transistors described in Embodiment 1 or 2.

Figure 12A:
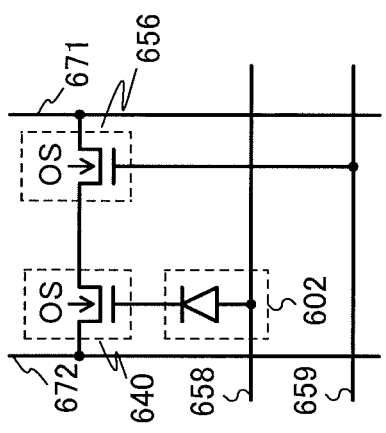
FIGS. 12A and 12B are views illustrating one embodiment of a semiconductor device.

An example of a semiconductor device having an image sensor function is shown in FIG. 12A. FIG. 12A shows an equivalent circuit of a photo sensor, and FIG. 12B is a cross-sectional view showing part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. The transistor 640 and the transistor 656 in FIG. 12A are transistors each including an oxide semiconductor film.

Figure 12B:
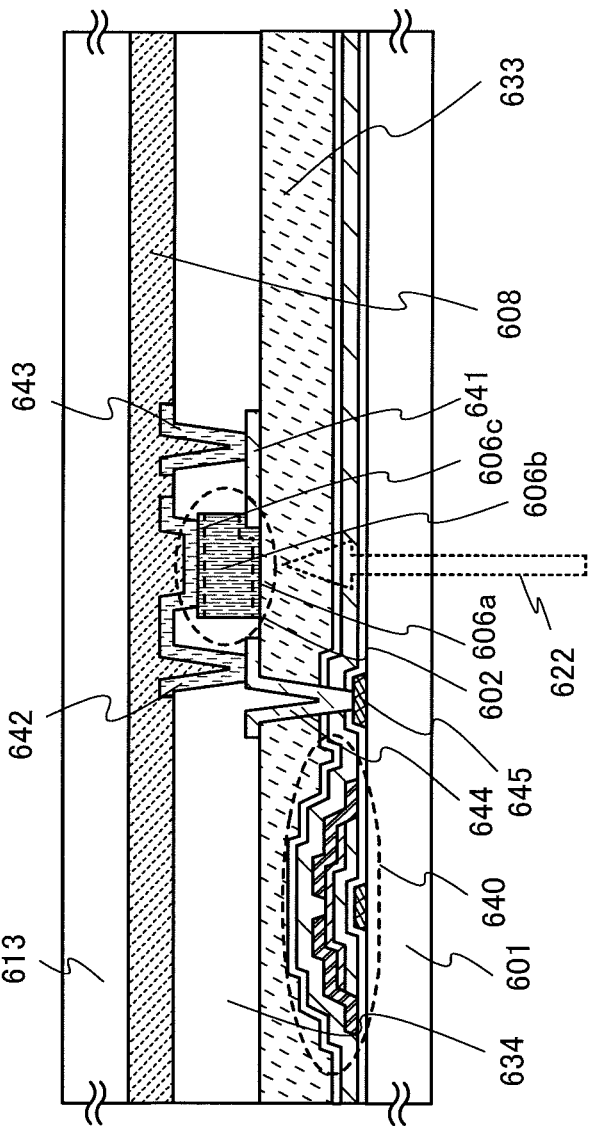

FIG. 12B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 provided therebetween. In addition, a first interlayer insulating layer 633 and a second interlayer insulating layer 634 are provided over the transistor 640.

The photodiode 602 is provided over the first interlayer insulating layer 633. In the photodiode 602, a first semiconductor layer 606a, a second semiconductor layer 606b, and a third semiconductor layer 606c are sequentially stacked from the first interlayer insulating layer 633 side, between an electrode layer 641 formed over the first interlayer insulating layer 633 and an electrode layer 642 formed over the second interlayer insulating layer 634.

Further, a gate electrode 645 is provided in the same layer as the gate electrode of the transistor 640 so as to be electrically connected to the gate electrode of the transistor 640. The gate electrode 645 is electrically connected to an electrode layer 644 formed on the first interlayer insulating layer 633 through an opening provided in the first interlayer insulating layer 633, a protective film of the transistor 640, and a gate insulating film of the transistor 640. The electrode layer 642 electrically connected to the third semiconductor layer 606c is electrically to the gate electrode 645 through the electrode layer 644, so that the photodiode 602 is electrically connected to the transistor 640. In addition, the electrode layer 641 electrically connected to the first semiconductor layer 606a is electrically connected to the conductive layer 643 formed on the second interlayer insulating layer 634.

In this embodiment, any of the transistors described in Embodiment 1 or 2 can be applied to the transistor 640. The transistor 640 and the transistor 656 have suppressed variation in electrical characteristics and are electrically stable. Therefore, a highly reliable semiconductor device can be provided as the semiconductor device of this embodiment described in FIGS. 12A and 12B.

Here, a pin photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is shown as an example.

The first semiconductor layer 606a is a p-type semiconductor layer and can be formed using an amorphous silicon film containing an impurity element imparting p-type conductivity. The first semiconductor layer 606a is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In that case, as a method for forming the amorphous silicon film, an LPCVD method, a chemical vapor deposition method, a sputtering method, or the like may be used. The first semiconductor layer 606a is preferably formed to have a thickness 10 nm or more and 50 nm or less.

The second semiconductor layer 606b is an i-type semiconductor layer (intrinsic semiconductor layer) and is formed using an amorphous silicon film. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness 200 nm or more and 1000 nm or less.

The third semiconductor layer 606c is an n-type semiconductor layer and is formed using an amorphous silicon film containing an impurity element imparting n-type conductivity. The third semiconductor layer 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion injecting method or the like in order to diffuse the impurity element. In that case, as a method for forming the amorphous silicon film, an LPCVD method, a chemical vapor deposition method, a sputtering method, or the like may be used. The third semiconductor layer 606c is preferably formed to have a thickness 20 nm or more and 200 nm or less.

The first semiconductor layer 606a, the second semiconductor layer 606b, and the third semiconductor layer 606c are not necessarily formed using an amorphous semiconductor, and may be formed using a polycrystalline semiconductor, or a micro crystalline semiconductor (a semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor contains hydrogen or halogen of at least 1 at. % to terminate a dangling bond. Moreover, microcrystalline silicon contains a rare gas element such as helium, argon, krypton, or neon to further promote lattice distortion, so that stability is increased and a favorable microcrystalline semiconductor can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed by using a gas containing silicon obtained by diluting $SiH_4$, $Si_2H_6$, $SiH_2Cl_2$, $SiHCl_3$, $SiCl_4$, or $SiF_4$, with hydrogen. Further, with a dilution with one or plural kinds of rare gas elements selected from helium, argon, krypton, neon in addition to silicon hydride and hydrogen, the microcrystalline semiconductor film can be formed. In that case, the flow ratio of hydrogen to silicon hydride is 5:1 to 200:1, preferably 50:1 to 150:1, more preferably 100:1. Further, a carbide gas such as $CH_4$ or $C_2H_6$, a gas containing germanium such as $GeH_4$ or $GeF_4$, $F_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here, an example where light 622 received by the photodiode 602 from a surface of the substrate 601, over which a pin photodiode is formed, is converted into electric signals will be described. Further, light approaching the semiconductor layer having a conductivity type opposite from that of the semiconductor layer on the light-receiving plane is disturbance light; therefore, the electrode layer on the semiconductor layer having the opposite conductivity type is preferably formed from a light-blocking conductive film. Note that a surface of the n-type semiconductor layer side can alternatively be used as the light-receiving plane.

For reduction of the surface roughness, an insulating layer functioning as a planarizing insulating film is preferably used as the first interlayer insulating layer 633 and the second interlayer insulating layer 634. The first interlayer insulating layer 633 and the second interlayer insulating layer 634 can be formed using, for example, an organic insulating material such as polyimide, an acrylic resin, a benzocyclobutene-based resin, polyamide, or an epoxy resin. As well as such organic insulating materials, it is possible to use a single layer or stacked layers of a low-dielectric constant material (a low-k material), a siloxane-based resin, phosphosilicate glass (PSG), borophosphosilicate glass (BPSG), or the like.

The first interlayer insulating layer 633 and the second interlayer insulating layer 634 can be formed using an insulating material by a sputtering method, a spin coating method, a dipping method, spray coating, a droplet discharge method (e.g., an inkjet method, screen printing, or offset printing), roll coating, curtain coating, knife coating, or the like depending on the material.

When the light that enters the photodiode 602 is detected, data on an object to be detected can be read. Note that a light source such as a backlight can be used at the time of reading data on the object.

Any of the transistors described in Embodiment 1 or 2 can be used as the transistor 640. The transistor including the oxide semiconductor film which is highly purified by intentionally removing an impurity such as hydrogen, moisture, a hydroxyl group, or hydride (also referred to as a hydrogen compound) and contains excessive oxygen supplied by oxygen doping treatment has electrical characteristics which are less likely to change, and thus is electrically stable. Therefore, a highly reliable semiconductor device can be provided.

The structures, the methods, and the like described in this embodiment can be combined as appropriate with any of the structures, the methods, and the like described in the other embodiments.

(Embodiment 7)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large-sized game machine such as a pachinko machine, and the like. Examples of electronic devices each including the liquid crystal display device described in the above embodiment will be described.

Figure 13A:
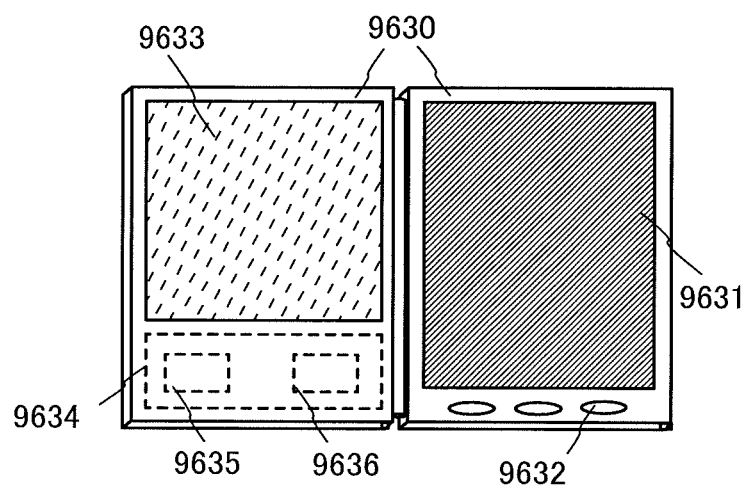
FIGS. 13A and 13B are views illustrating an electronic device.

FIG. 13A shows an electronic book reader (also referred to as an e-book reader) which can include housings 9630, a display portion 9631, operation keys 9632, a solar cell 9633, and a charge and discharge control circuit 9634. The electronic book reader shown in FIG. 13A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that in FIG. 13A, the charge and discharge control circuit 9634 has a battery 9635 and a DCDC converter (hereinafter, abbreviated as a converter) 9636. The semiconductor device described in any of the above embodiments can be applied to the display portion 9631, whereby the electronic book reader can be highly reliable.

In the case where a transflective liquid crystal display device or a reflective liquid crystal display device is used as the display portion 9631, use under a relatively bright condition is assumed; therefore, the structure shown in FIG. 13A is preferable because power generation by the solar cell 9633 and charge with the battery 9635 are effectively performed. Since the solar cell 9633 can be provided in a space (a surface or a rear surface) of the housing 9630 as appropriate, the battery 9635 can be efficiently charged, which is preferable. When a lithium ion battery is used as the battery 9635, there is an advantage of downsizing or the like.

Figure 13B:
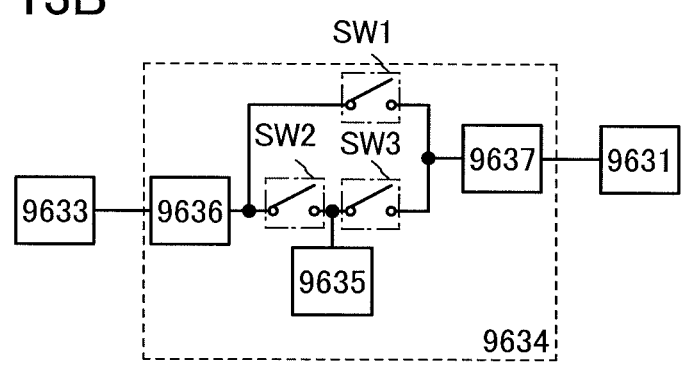

The structure and the operation of the charge and discharge control circuit 9634 shown in FIG. 13A will be described with reference to a block diagram in FIG. 13B. The solar cell 9633, the battery 9635, the converter 9636, a converter 9637, switches SW1 to SW3, and the display portion 9631 are shown in FIG. 13B, and the battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, for example, the switch SW1 is turned off and the switch SW2 is turned on so that the battery 9635 is charged.

Next, operation in the case where power is not generated by the solar cell 9633 using external light is described. The voltage of power accumulated in the battery 9635 is raised or lowered by the converter 9637 by turning on the switch SW3. Then, power from the battery 9635 is used for the operation of the display portion 9631.

Note that although the solar cell 9633 is described as an example of a means for charge, charge of the battery 9635 may be performed with another means. In addition, a combination of the solar cell 9633 and another means for charge may be used.

Figure 14A:
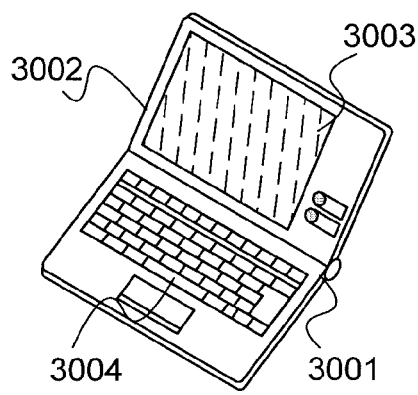
FIGS. 14A to 14F are views each illustrating an electronic device.

FIG. 14A shows a laptop personal computer, which includes a main body 3001, a housing 3002, a display portion 3003, a keyboard 3004, and the like. By applying the semiconductor device described in any of the above embodiments to the display portion 3003, the laptop personal computer can be highly reliable.

Figure 14B:
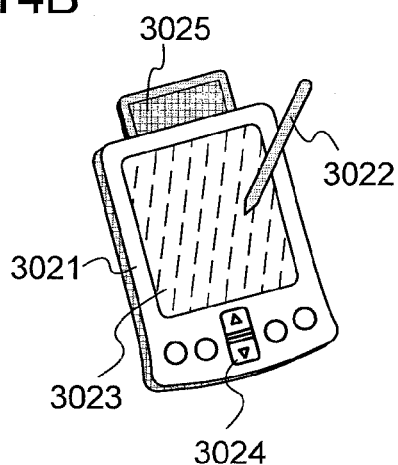

FIG. 14B is a personal digital assistant (PDA), which includes a main body 3021 provided with a display portion 3023, an external interface 3025, operation buttons 3024, and the like. A stylus 3022 is included as an accessory for operation. By applying the semiconductor device described in any of the above embodiments to the display portion 3023, the personal digital assistant (PDA) can be highly reliable.

Figure 14C:
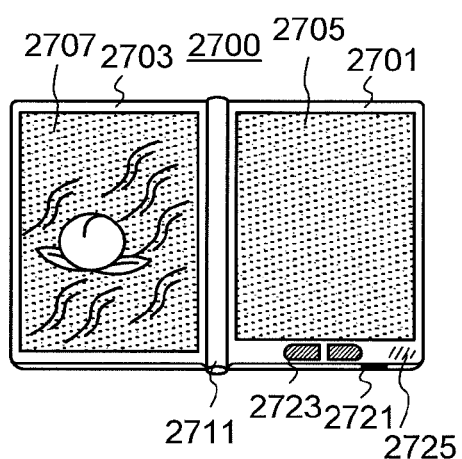

FIG. 14C shows an example of an electronic book reader. For example, an electronic book reader 2700 includes two housings, i.e., a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 14C) displays text and the left display portion (the display portion 2707 in FIG. 14C) displays images. By applying the semiconductor devices described in any of the above embodiments to the display portions 2705 and 2707, the electronic book reader 2700 can be highly reliable.

FIG. 14C shows an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a structure capable of wirelessly transmitting and receiving data. Through wireless communication, desired book data or the like can be purchased and downloaded from an electronic book server.

Figure 14D:
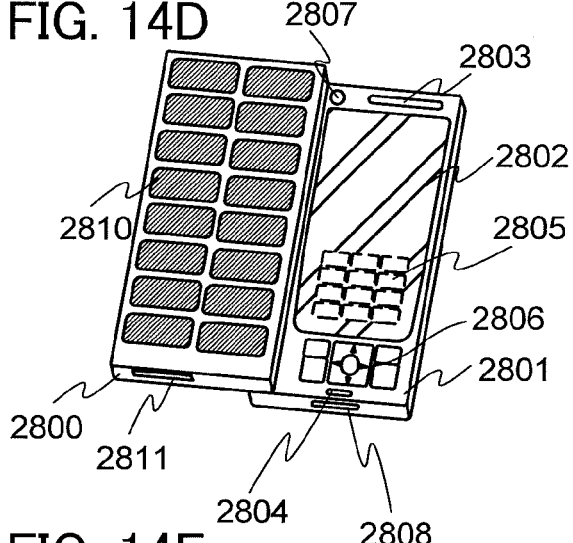

FIG. 14D shows a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. By applying the semiconductor device described in any of the above embodiments to the display panel 2802, the mobile phone can be highly reliable.

Further, the display panel 2802 is provided with a touch panel. A plurality of operation keys 2805 which is displayed as images is shown by dashed lines in FIG. 14D. Note that a boosting circuit by which a voltage output from the solar cell 2810 is increased to be sufficiently high for each circuit is also provided.

The display direction of the display panel 2802 is changed as appropriate depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as shown in FIG. 14D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 14E:
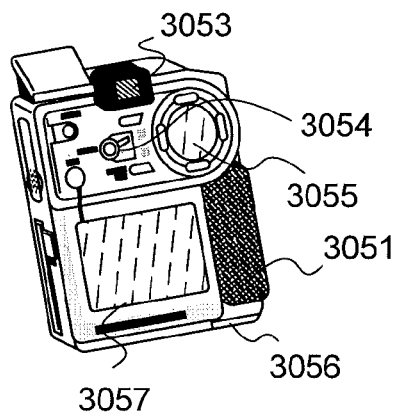

FIG. 14E shows a digital video camera which includes a main body 3051, a display portion A 3057, an eyepiece portion 3053, an operation switch 3054, a display portion B 3055, a battery 3056, and the like. By applying the semiconductor device described in any of the above embodiments to the display portion A 3057 and the display portion B 3055, the digital video camera can be highly reliable.

Figure 14F:
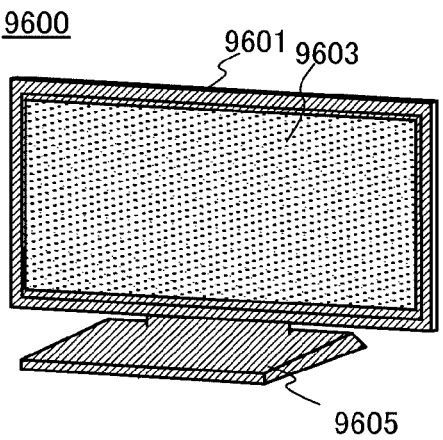
Figure 15:
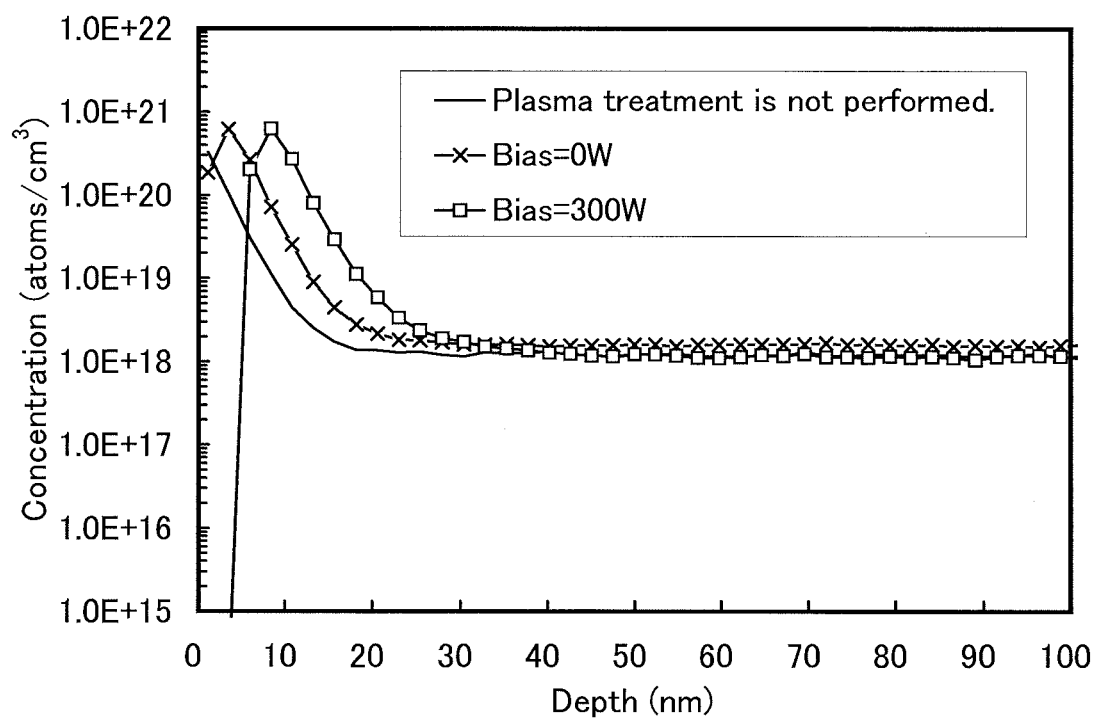
FIG. 15 is a graph showing a measurement result of SIMS.
Figure 16A:
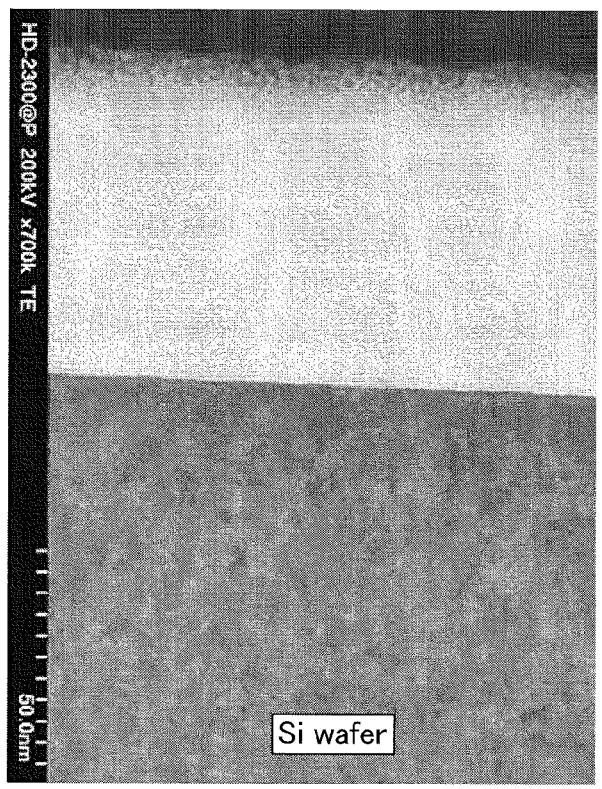
FIGS. 16A and 16B are views illustrating STEM images.
Figure 16B:
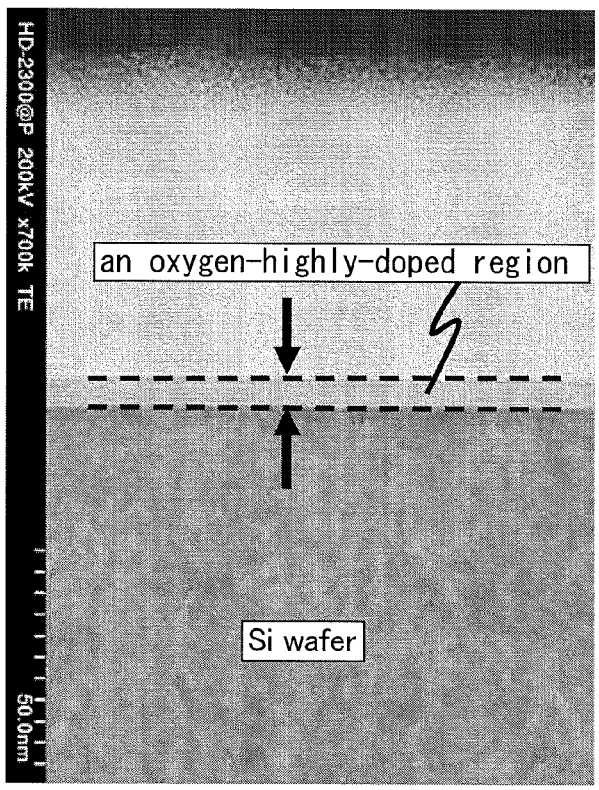

FIG. 14F shows an example of a television device. In a television set 9600, a display portion 9603 is incorporated in a housing 9601. The display portion 9603 can display images. Here, the housing 9601 is supported by a stand 9605. By applying the semiconductor device described in any of the above embodiments to the display portion 9603, the television set 9600 can be highly reliable.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, the methods, and the like described in this embodiment can be combined as appropriate with any of the structures, the methods, and the like described in the other embodiments.

This application is based on Japanese Patent Application serial no. 2010-112037 filed with Japan Patent Office on May 14, 2010, the entire contents of which are hereby incorporated by reference.

The invention claimed is:

1. A method for manufacturing a semiconductor device, comprising the steps of:
 forming a gate electrode;
 forming a first insulating film over the gate electrode;
 performing halogen doping treatment on the first insulating film so that the first insulating film is supplied with a halogen atom;
 forming an oxide semiconductor film over the first insulating film so that the oxide semiconductor film overlaps with the gate electrode;
 performing first heat treatment on the oxide semiconductor film so that a hydrogen atom in the oxide semiconductor film is removed;
 performing oxygen doping treatment on the oxide semiconductor film from which the hydrogen atom is removed so that the oxide semiconductor film is supplied with an oxygen atom;
 performing second heat treatment on the oxide semiconductor film to which the oxygen atom is supplied;
 forming a source electrode and a drain electrode on and in contact with the oxide semiconductor film; and
 forming a second insulating film on and in contact with the oxide semiconductor film.

2. The method for manufacturing a semiconductor device, according to claim 1, further comprising the step of forming a third insulating film containing nitrogen so that the third insulating film containing nitrogen covers the second insulating film.

3. The method for manufacturing a semiconductor device, according to claim 1, further comprising the step of processing the oxide semiconductor film into an island-shaped oxide semiconductor film.

4. The method for manufacturing a semiconductor device, according to claim 3, wherein at least part of the first insulating film is processed into an island-shaped first insulating film in the step of processing the oxide semiconductor film into the island-shaped oxide semiconductor film.

5. The method for manufacturing a semiconductor device, according to claim 3, wherein the second insulating film is in contact with the first insulating film.

6. The method for manufacturing a semiconductor device, according to claim 1, wherein at least one of the first insulating film and the second insulating film contains a constituent element of the oxide semiconductor film.

7. The method for manufacturing a semiconductor device, according to claim 1, wherein at least one of the first insulating film and the second insulating film has a stacked-layer structure comprising a third insulating film containing a constituent element of the oxide semiconductor film and a fourth insulating film containing an element different from the constituent element of the oxide semiconductor film.

8. The method for manufacturing a semiconductor device, according to claim 1, wherein at least one of the first insulating film and the second insulating film contains gallium.

9. The method for manufacturing a semiconductor device, according to claim 1, wherein at least one of the first insulating film and the second insulating film has a stacked-layer structure comprising a third insulating film containing gallium and a fourth insulating film containing a material different from gallium.

10. The method for manufacturing a semiconductor device, according to claim 1, wherein chlorine is used in the halogen doping treatment.

11. The method for manufacturing a semiconductor device, according to claim 1, further comprising the step of forming a third insulating film over the first insulating film.

12. The method for manufacturing a semiconductor device, according to claim 11,
   wherein the first insulating film contains an element different from a constituent element of the oxide semiconductor film, and
   wherein the third insulating film contains the constituent element of the oxide semiconductor film.

13. The method for manufacturing a semiconductor device, according to claim 11,
   wherein the first insulating film contains a material different from gallium, and
   wherein the third insulating film contains gallium.

* * * * *